(12) United States Patent
Chang et al.

(10) Patent No.: US 9,362,169 B2
(45) Date of Patent: Jun. 7, 2016

(54) SELF-ALIGNED SEMICONDUCTOR FABRICATION WITH FOSSE FEATURES

(71) Applicant: Taiwan Semiconductor Manufacturing Company, Ltd., Hsin-Chu (TW)

(72) Inventors: Shih-Ming Chang, Hsinchu County (TW); Ken-Hsien Hsieh, Taipei (TW); Chih-Ming Lai, Hsinchu (TW); Ming-Feng Shieh, Tainan County (TW); Ru-Gun Liu, Hsinchu County (TW); Tsai-Sheng Gau, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/266,878

(22) Filed: May 1, 2014

(65) Prior Publication Data

US 2015/0318209 A1 Nov. 5, 2015

(51) Int. Cl.
*H01L 21/3213* (2006.01)
*H01L 21/311* (2006.01)
*H01L 21/768* (2006.01)

(52) U.S. Cl.
CPC .... *H01L 21/76897* (2013.01); *H01L 21/31111* (2013.01); *H01L 21/31144* (2013.01); *H01L 21/32133* (2013.01); *H01L 21/32139* (2013.01)

(58) Field of Classification Search
None
See application file for complete search history.

(56) References Cited

U.S. PATENT DOCUMENTS

| | | | | |
|---|---|---|---|---|
| 8,143,156 B2* | 3/2012 | Matamis | ............... | H01L 27/115 438/622 |
| 8,298,943 B1* | 10/2012 | Arnold et al. | .................. | 438/667 |
| 8,629,048 B1* | 1/2014 | Sipani | ................. | H01L 21/0337 438/587 |
| 8,835,328 B2* | 9/2014 | Hwang | ............. | H01L 29/66795 438/694 |
| 8,871,646 B2* | 10/2014 | DeVilliers | ........... | H01L 21/0273 438/689 |
| 2008/0008969 A1* | 1/2008 | Zhou | .................... | H01L 21/0337 430/313 |
| 2013/0034962 A1* | 2/2013 | Yu | ................................. | 438/696 |
| 2015/0243519 A1* | 8/2015 | deVilliers | ........... | H01L 21/0228 438/692 |

* cited by examiner

*Primary Examiner* — Marc Armand
*Assistant Examiner* — Younes Boulghassoul
(74) *Attorney, Agent, or Firm* — Haynes and Boone, LLP

(57) ABSTRACT

The present disclosure describes methods for transferring a desired layout into a target layer on a semiconductor substrate. An embodiment of the methods includes forming a first desired layout feature as a first line over the target layer; forming a spacer around the first line; depositing a spacer-surrounding material layer; removing the spacer to form a fosse pattern trench surrounding the first line; and transferring the fosse pattern trench into the target layer to form a fosse feature trench in the target layer, wherein the fosse feature trench surrounds a first portion of the target layer that is underneath a protection layer. In some embodiments, the method further includes patterning a second desired layout feature of the desired layout into the target layer wherein the fosse feature trench and the protection layer serve to self-align the second desired layout feature with the first portion of the target layer.

19 Claims, 29 Drawing Sheets

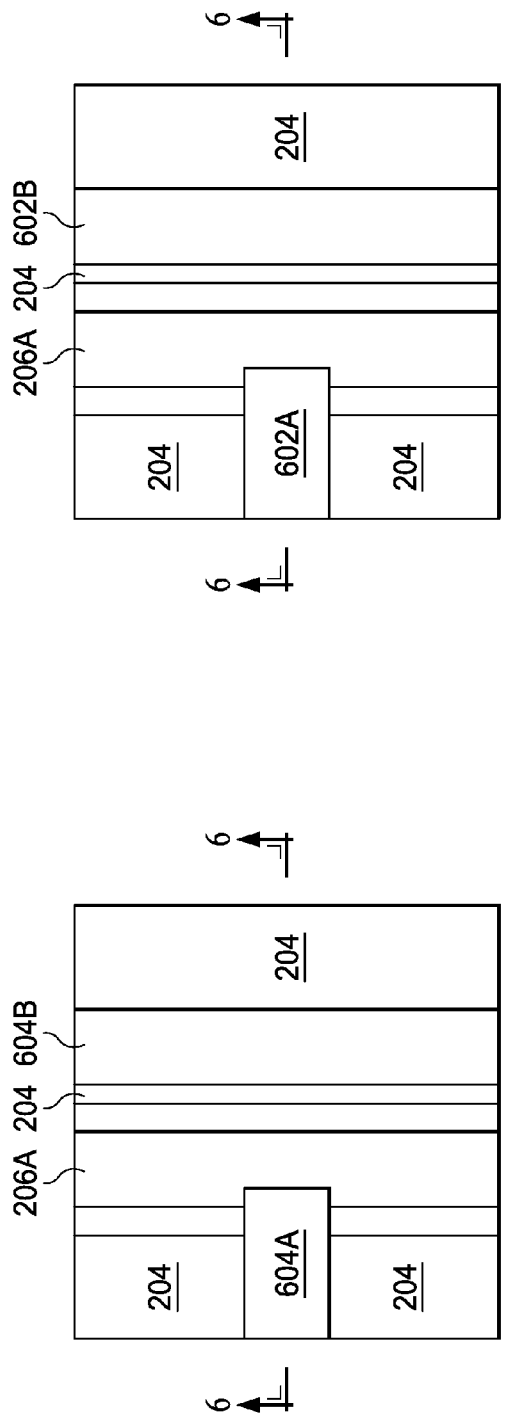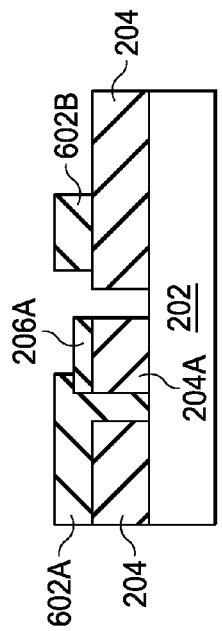
Fig. 6E
Fig. 6F
Fig. 6G
Fig. 6H

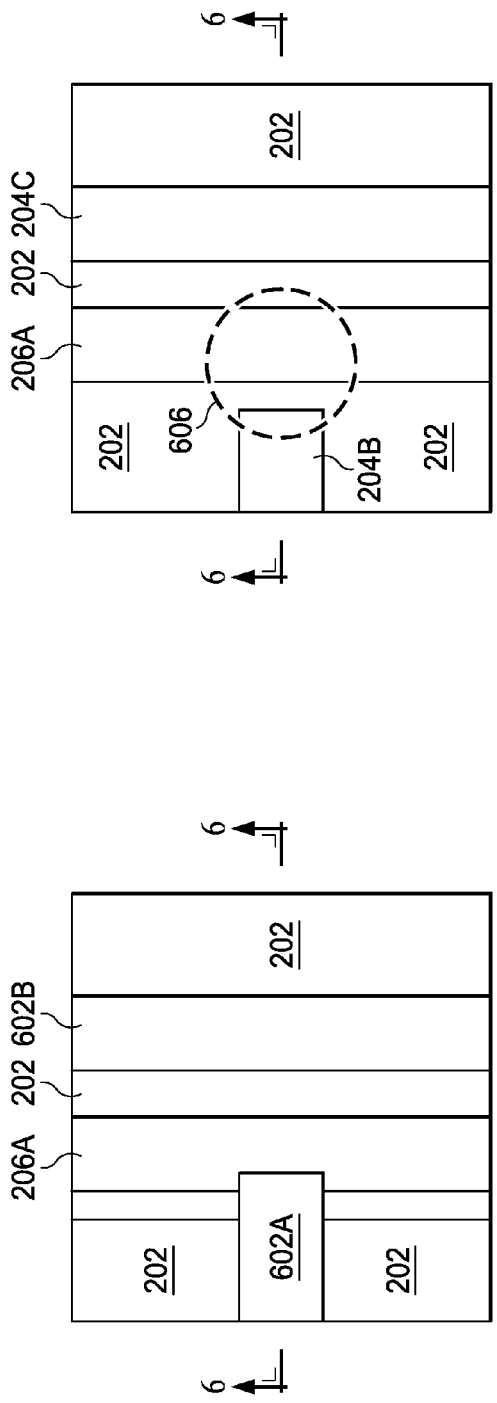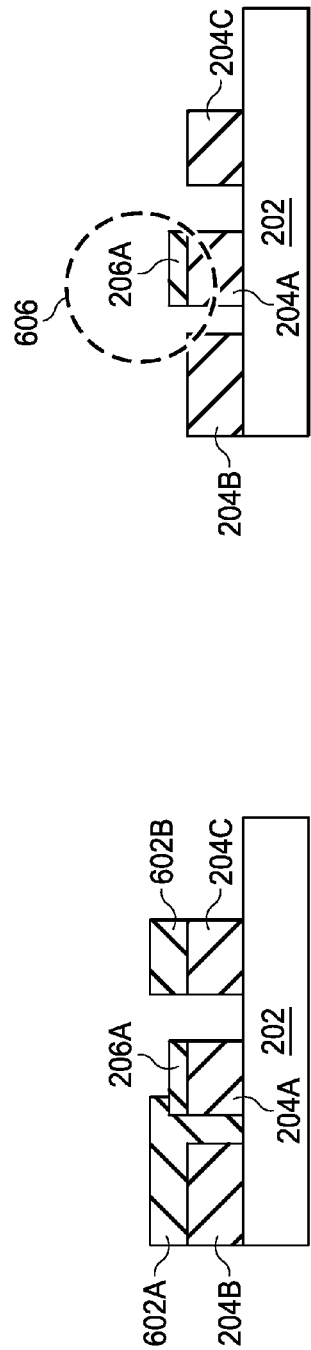
Fig. 6I
Fig. 6J
Fig. 6K
Fig. 6L

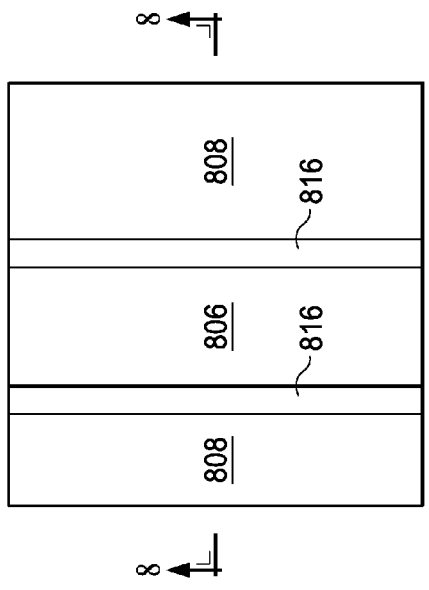
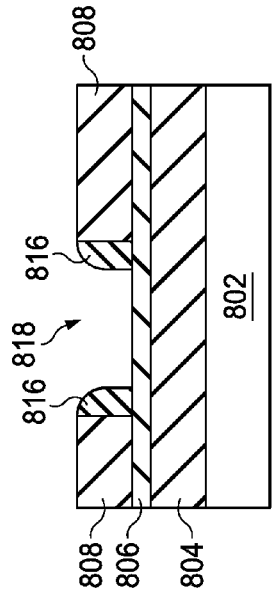
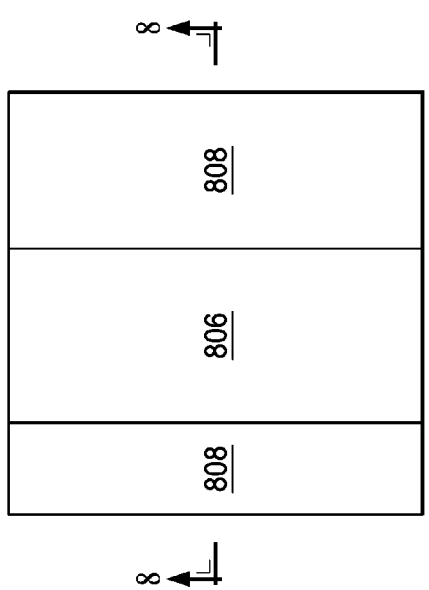
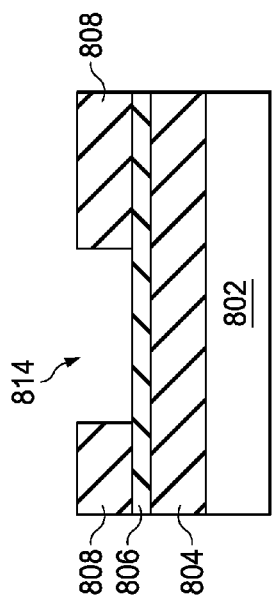

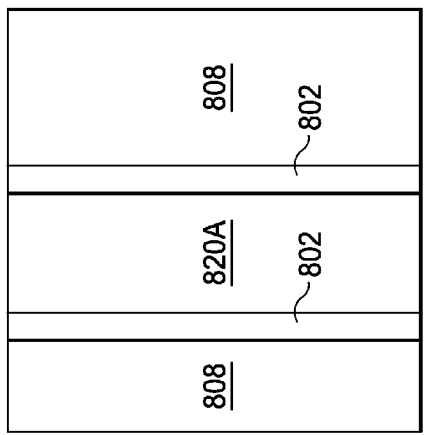
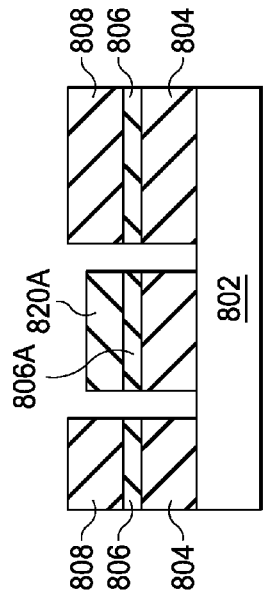
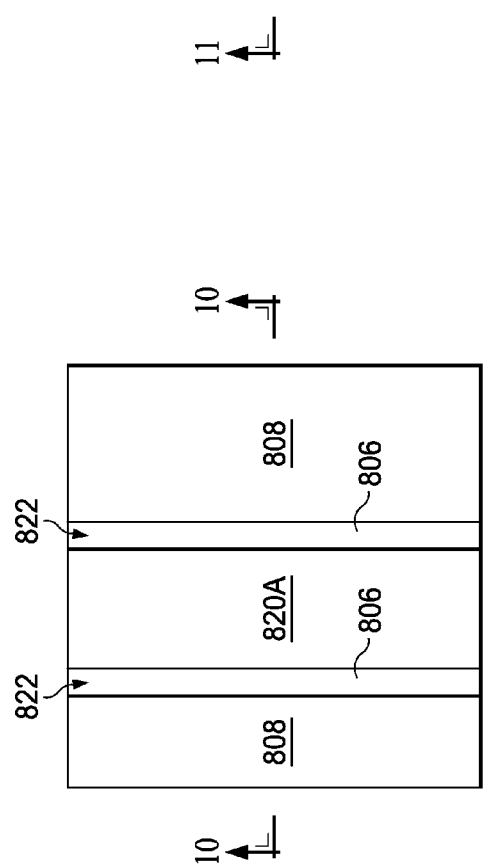
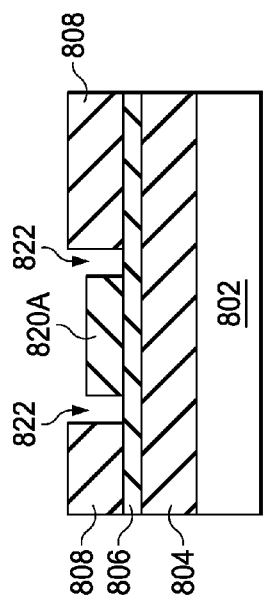

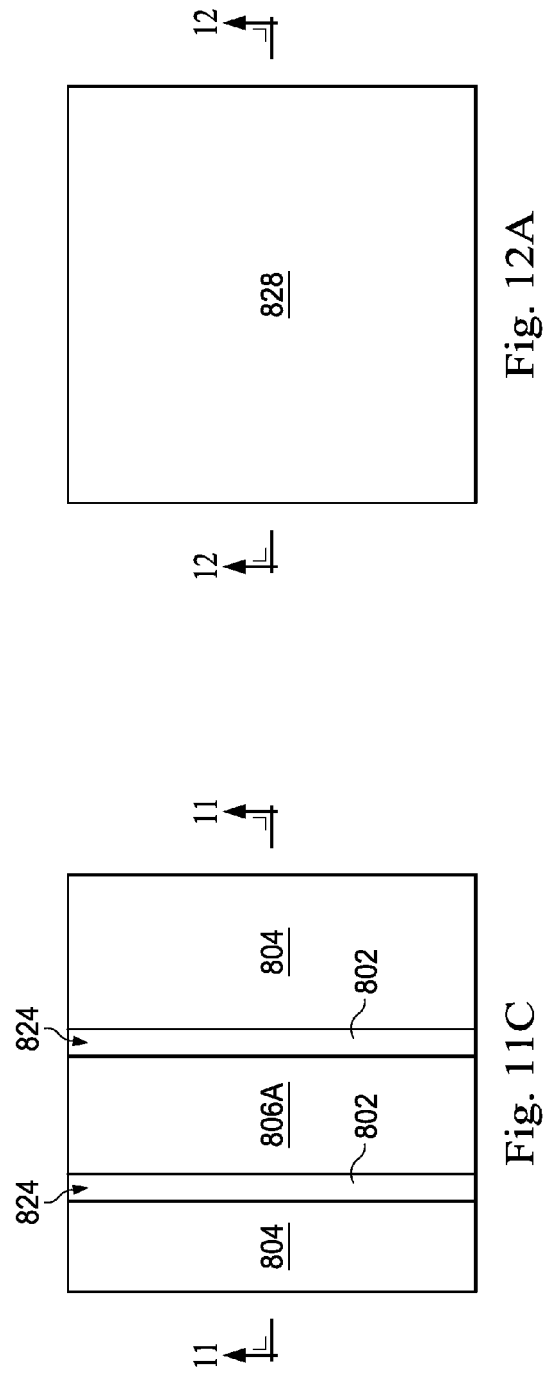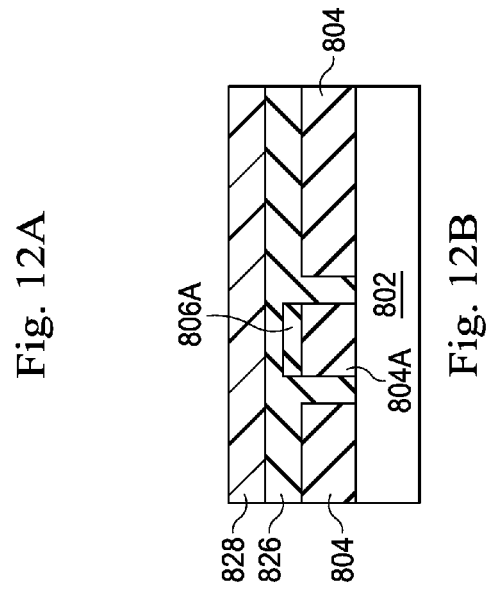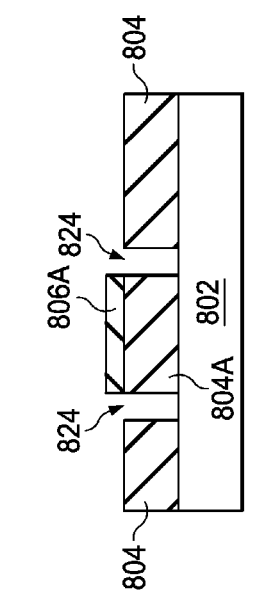

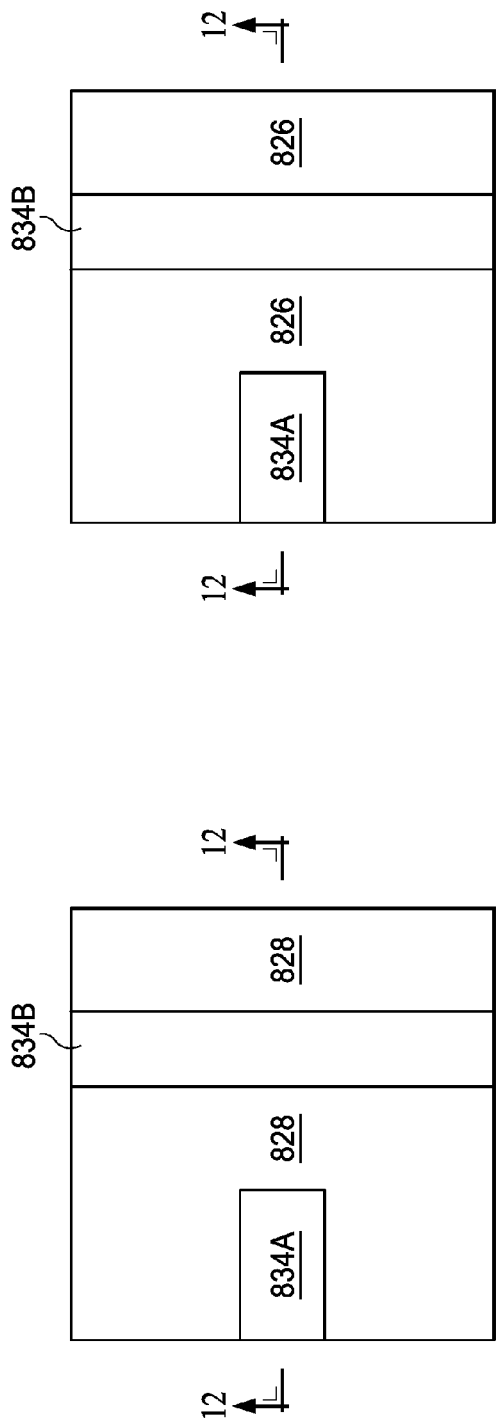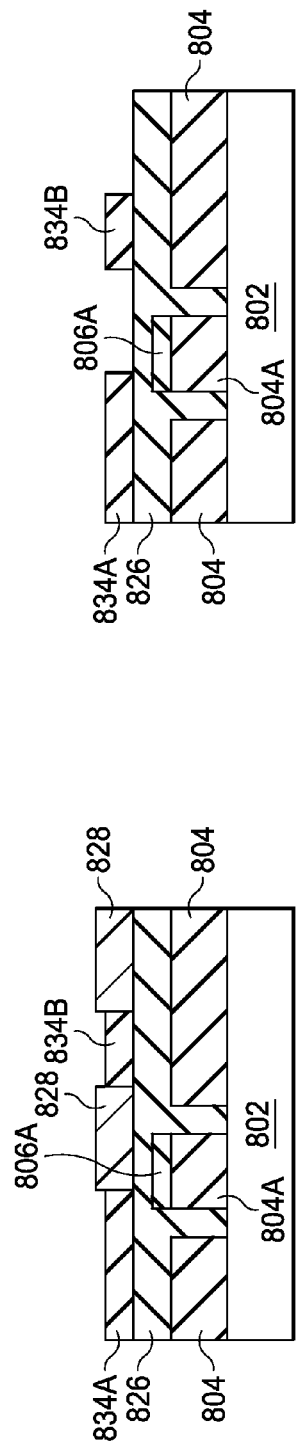
Fig. 12G  Fig. 12H  Fig. 12I  Fig. 12J

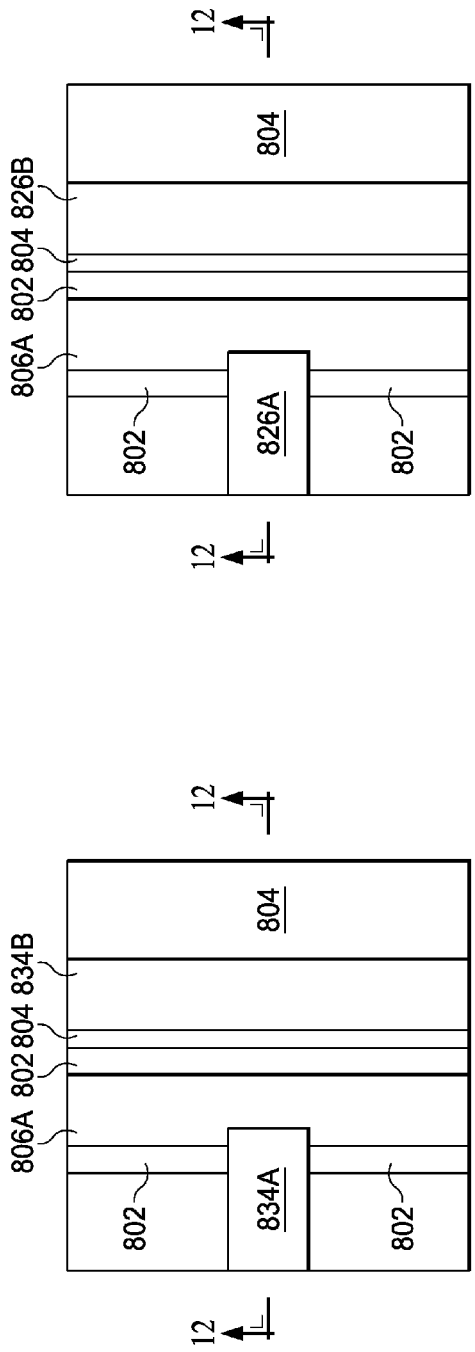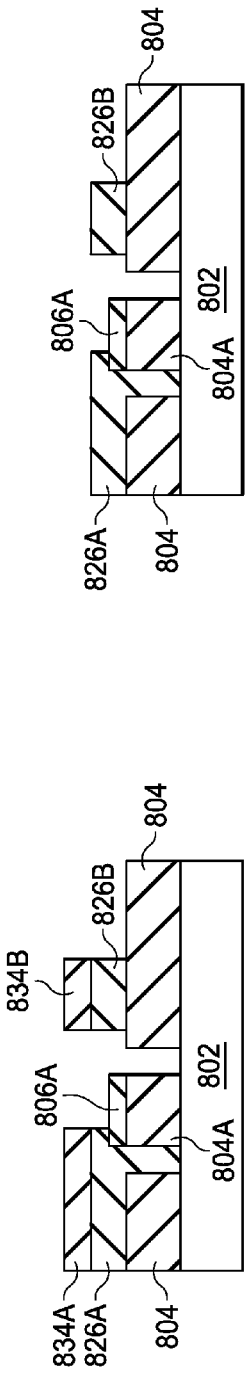

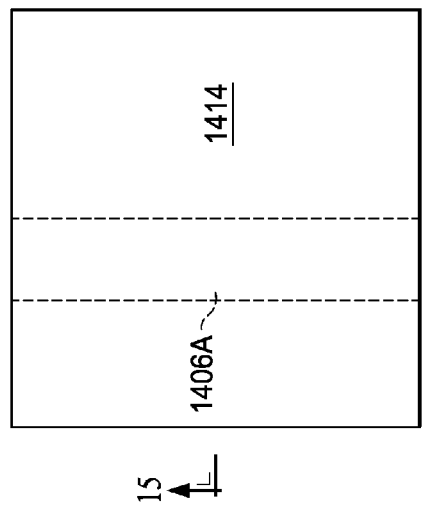
Fig. 14E
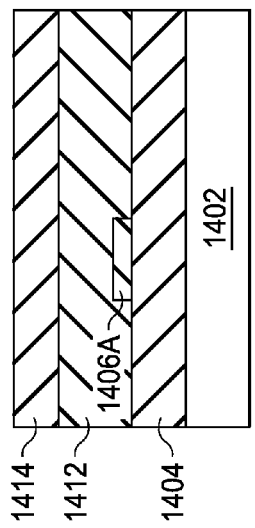
Fig. 14F
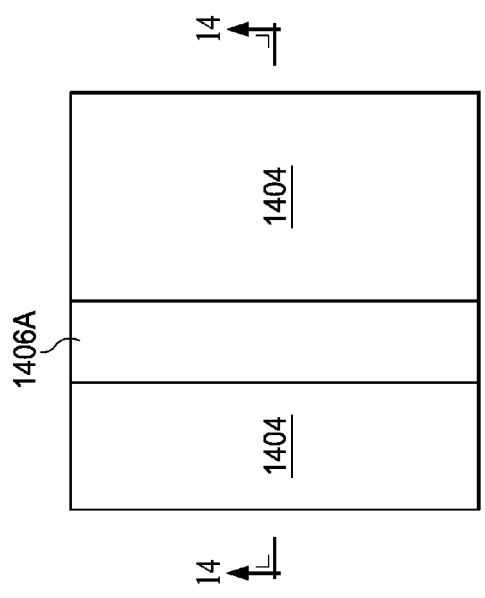
Fig. 15A
Fig. 15B

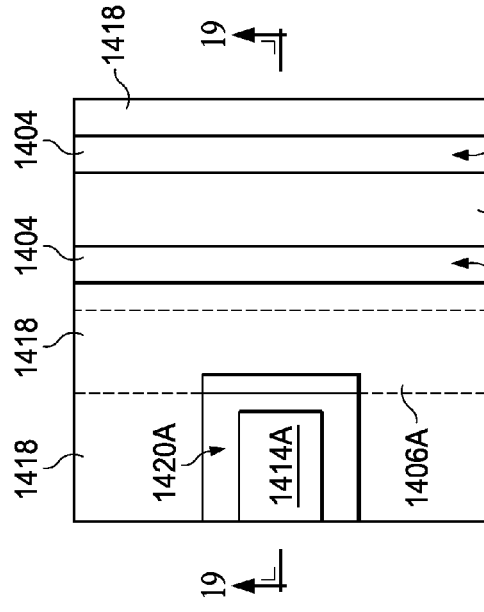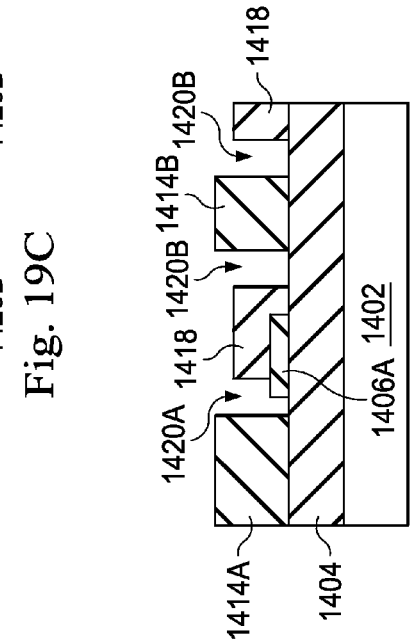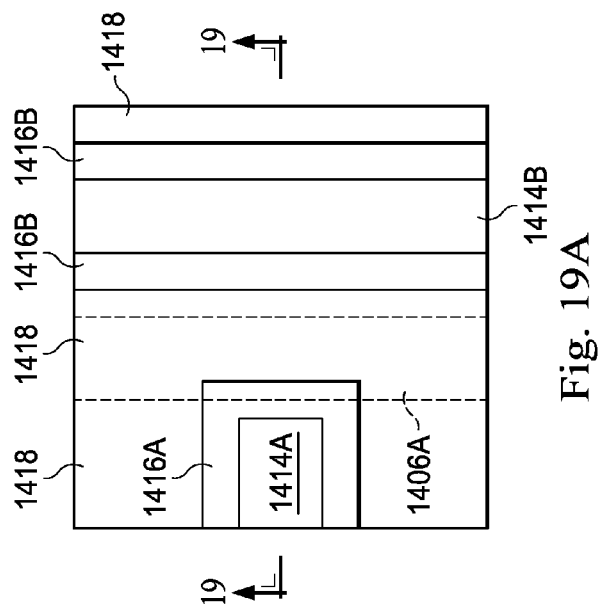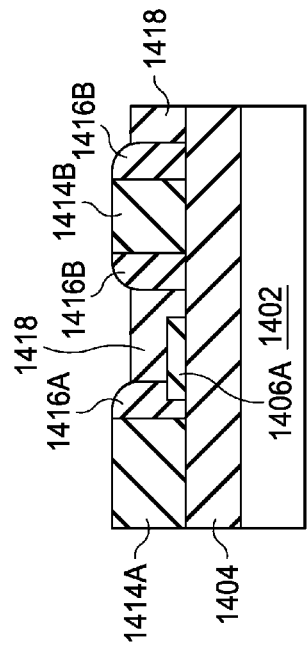
Fig. 19A
Fig. 19B
Fig. 19C
Fig. 19D

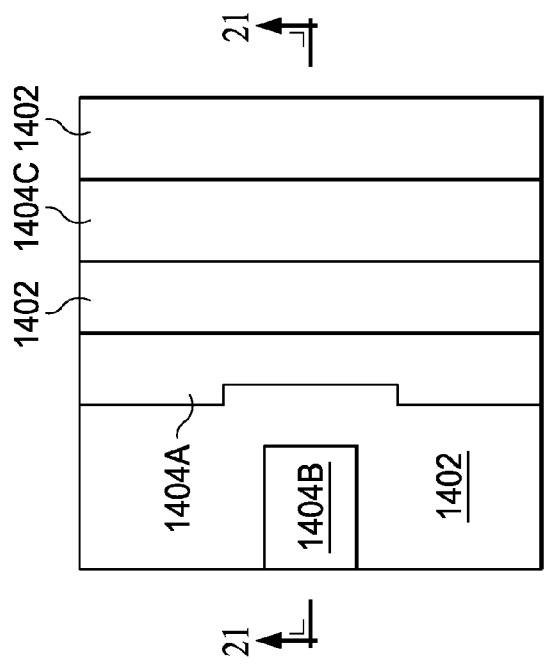
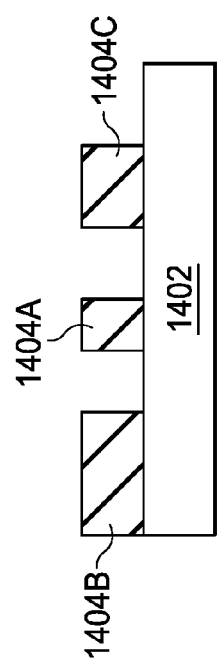
Fig. 21C
Fig. 21D

SELF-ALIGNED SEMICONDUCTOR FABRICATION WITH FOSSE FEATURES

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6A, 6B, 6C, 6D, 6E, 6F, 6G, 6H, 6I, 6J, 6K, 6L, 6M, and 6N are pairs of fragmentary top view and fragmentary cross-sectional diagrams of a semiconductor substrate during processing according to the flowchart of FIG. 1.

FIGS. 8A, 8B, 8C, 8D, 8E, 8F, and 8G are pairs of fragmentary top view and fragmentary cross-sectional diagrams of a semiconductor substrate during processing according to the flowchart of FIG. 7.

FIGS. 10A and 10B are a pair of fragmentary top view and fragmentary cross-sectional diagrams of a semiconductor substrate during processing according to the flowchart of FIG. 7.

FIGS. 11A, 11B, 11C, and 11D are pairs of fragmentary top view and fragmentary cross-sectional diagrams of a semiconductor substrate during processing according to the flowchart of FIG. 7.

FIGS. 12A, 12B, 12C, 12D, 12E, 12F, 12G, 12H, 12I, 12J, 12K, 12L, 12M, 12N, 12O, 12P, 12Q, 12R, 12S and 12T are pairs of fragmentary top view and fragmentary cross-sectional diagrams of a semiconductor substrate during processing according to the flowchart of FIG. 7.

FIGS. 14A, 14B, 14C, 14D, 14E, and 14F are pairs of fragmentary top view and fragmentary cross-sectional diagrams of a semiconductor substrate during processing according to the flowchart of FIG. 13.

FIGS. 15A and 15B are a pair of fragmentary top view and fragmentary cross-sectional diagrams of a semiconductor substrate during processing according to the flowchart of FIG. 13.

FIGS. 19A, 19B, 19C, 19D, 19E, and 19F are pairs of fragmentary top view and fragmentary cross-sectional diagrams of a semiconductor substrate during processing according to the flowchart of FIG. 13.

FIGS. 21A, 21B, 21C, and 21D are pairs of fragmentary top view and fragmentary cross-sectional diagrams of a semiconductor substrate during processing according to the flowchart of FIG. 13.

DETAILED DESCRIPTION

Figure 1:
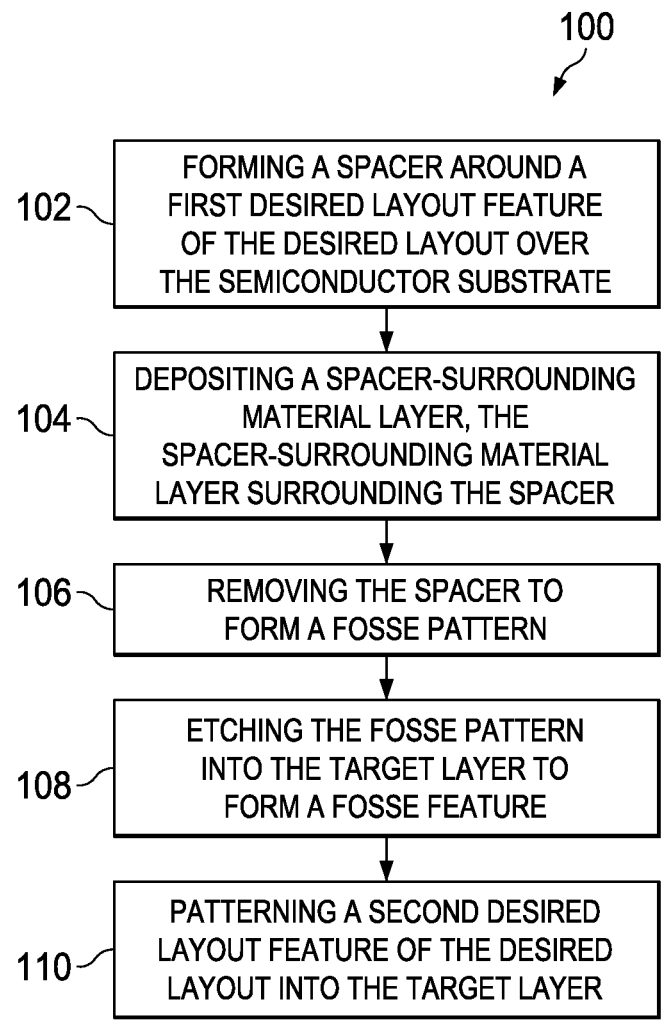
FIG. 1 is a flowchart of a method for transferring a desired layout into a target layer on a semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor device fabrication, the pursuit of smaller feature size has required a number of technological changes, including changes in the fabrication processes uses to create features on a semiconductor wafer. More recently, to mitigate the difficulties presented by the increasingly small features, multiple lithography processes have been applied in patterning a single target layer. For example, a first photolithography step is used in a multiple lithography process to pattern some features according to a desired layout, while a second photolithography step is used to pattern other features according to the same desired layout to be produced in the target layer. Sub-layouts and corresponding submasks may be used to pattern a desired layout in stages. Some such processes may include double-lithography, double-etch (LELE), self-aligned double patterning (SADP) and similar processes. However, such multiple lithography processes have not been entirely satisfactory.

FIG. 1 illustrates a method 100 for transferring a desired layout into a target layer on a semiconductor substrate. As illustrated in FIG. 1, method 100 includes several enumerated steps. However, some embodiments of the method 100 include additional steps before, after, and/or in between the enumerated steps. To more clearly describe at least one embodiment of the method 100 reference is made in discussing steps 102-110 to additional figures, including FIGS. 2A-2H, 3A-B, 4A-B, 5A-D, and 6A-N. In order to transfer or form the desired layout into a target layer on a semiconductor substrate FIG. 1 may begin in step 102 in which a spacer is formed around a first desired layout feature pattern of a desired layout. Aspects of step 102 may be seen in an embodiment illustrated in FIGS. 2A-2F.

Figure 2C:
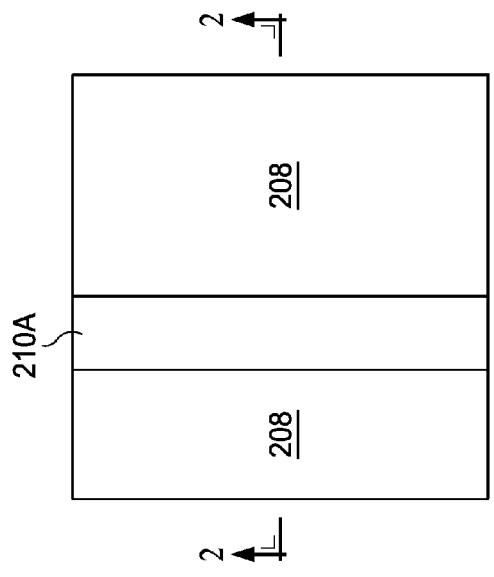
FIGS. 2A, 2B, 2C, 2D, 2E, 2F, 2G, and 2H are pairs of fragmentary top view and fragmentary cross-sectional diagrams of a semiconductor substrate during processing according to the flowchart of FIG. 1.
Figure 2D:
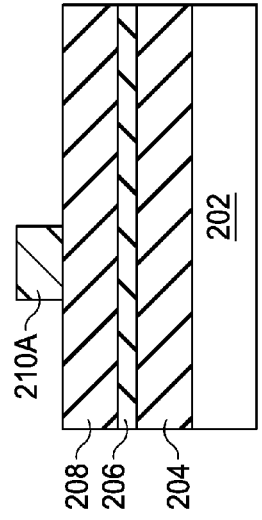
Figure 2A:
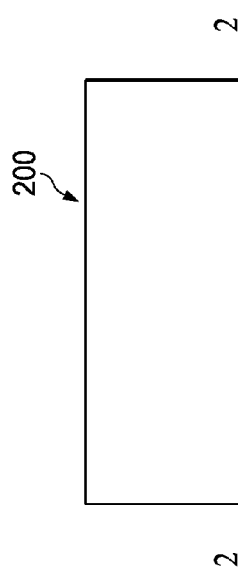
Figure 2B:
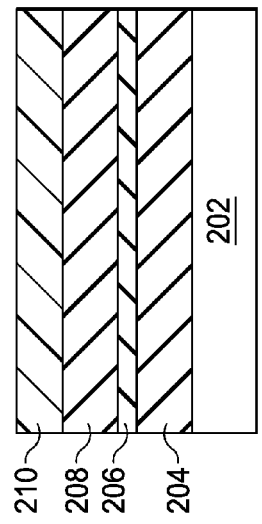
Figure 2G:
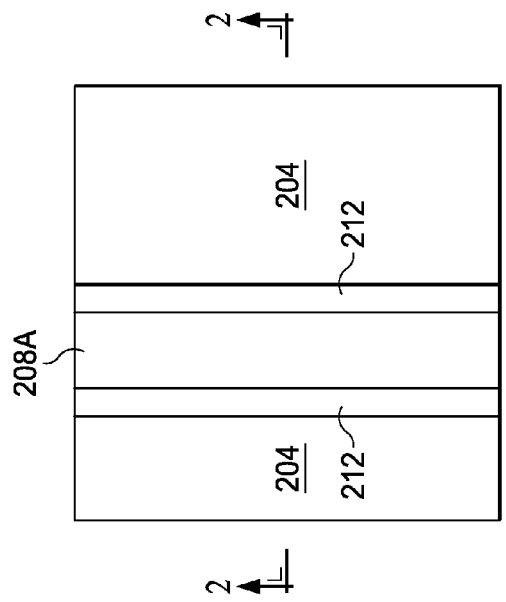
Figure 2H:
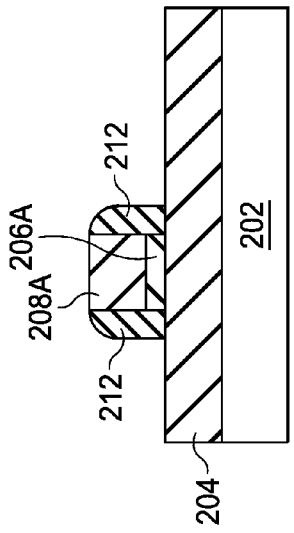
Figure 2E:
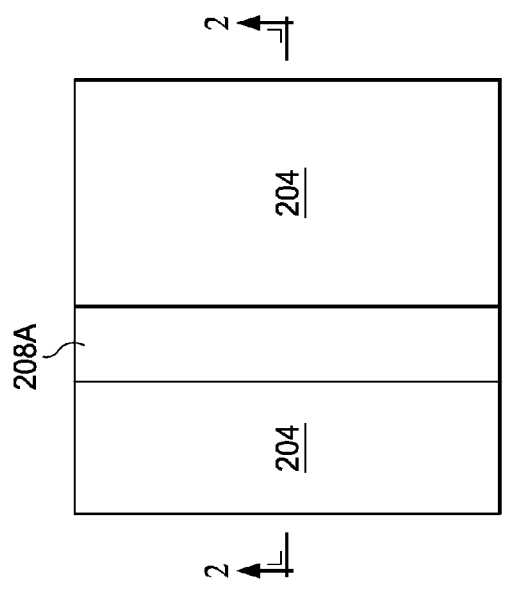
Figure 2F:
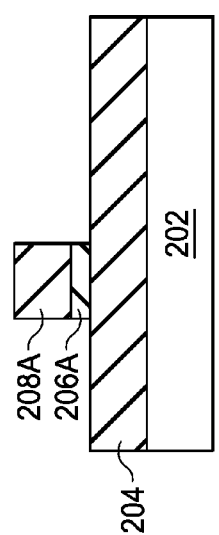

FIGS. 2A and 2B, 2C and 2D, and 2E and 2F are corresponding pairs of top views and cross-sectional views of a portion or fragment of a wafer 200. As seen in FIG. 2B which is a cross-section taken along line 2-2 of FIG. 2A, the wafer 200 includes a substrate 202 with a target material layer or target layer 204 thereon. The substrate 202 is a silicon substrate, but may be another substrate material such as silicon oxide, silicon carbide, sapphire, or still other substrates. The target layer 204 is an intermediate dielectric layer, but in other embodiments may be a conductive layer such as doped polysilicon or a metal layer. While FIGS. 2A, 2B, and other figures do not illustrate any layers between the substrate 202 and the target layer 204, one or more intermediate material layers may be disposed therebetween. This may apply to other layers discussed throughout the present disclosure. Over the target layer 204, there is a hard mask layer 206, which is made from titanium nitride, but may also be made from another suitable hard mask material. A patterning layer 208 is deposited over the hard mask layer 206. In order to pattern the patterning layer 208, a photoresist or PR layer 210 is deposited over the patterning layer 208. The PR layer 210 is shown in FIG. 2A as covering the entire illustrated fragment of the wafer 200.

As illustrated in FIGS. 2C and 2D, by using a photolithographic mask and process, a patterned PR feature 210A is formed and a portion of the patterning layer 208 is exposed. The mask used corresponds to a portion or sub-layout of a desired layout. In multiple lithography processes, a desired layout may be decomposed into two or more sub-layouts that are then transferred sequentially to pattern a material layer. The patterned PR feature 210A corresponds to a first desired layout feature pattern. This desired layout feature pattern is to be transferred into the target layer 204. An etch process, wet or dry, is performed to remove the exposed portions of the patterning layer 208, the result of which is seen in top view in FIG. 2E and in cross-section in FIG. 2F. After this etching process, the exposed portions of the patterning layer 208 and the subsequently exposed portions of the hard mask layer 206 are also removed. Afterwards, the patterned PR feature 210A is removed. As illustrated, this patterning process includes two different etch steps: one to remove the exposed portions of the patterning layer 208 to form a patterning layer feature 208A, and another to remove the subsequently exposed portions of the hard mask layer 206 to form a hard mask feature 206A. In some embodiments, a single etch step or process may be used. Both the patterning layer feature 208A and the hard mask feature 206A conform to the first desired layout feature pattern.

After the patterning layer feature 208A and the hard mask feature 206A are formed, a spacer material layer is deposited over these features and over the exposed surface of the target layer 204. For example, an oxide layer is formed over the wafer 200, by etching and/or chemical mechanical polishing/planarization, the spacer 212 is formed over the wafer 200. As illustrated, the spacer 212 is formed over the target layer 204 and in contact with sidewalls of the patterning layer feature 208A and the hard mask feature 206A. The patterning layer feature 208A and the hard mask feature 206A form a line, the ends of which are not depicted. However, the spacer 212 may surround the patterning layer feature 208A and the hard mask feature 206A on all sides.

Figure 3A:
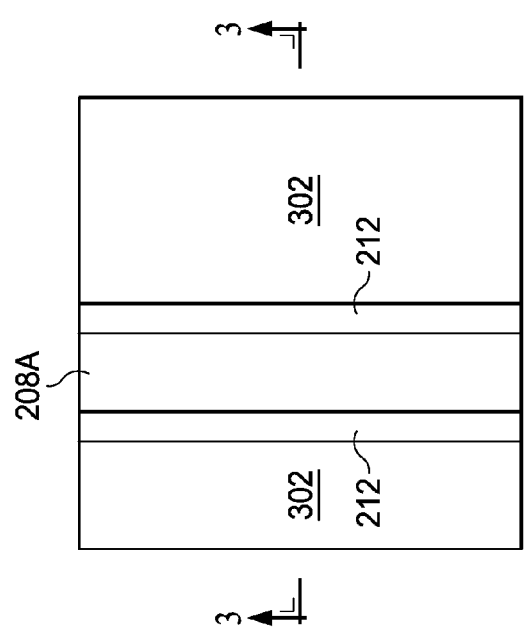
FIGS. 3A and 3B are a pair of fragmentary top view and fragmentary cross-sectional diagrams of a semiconductor substrate during processing according to the flowchart of FIG. 1.
Figure 3B:
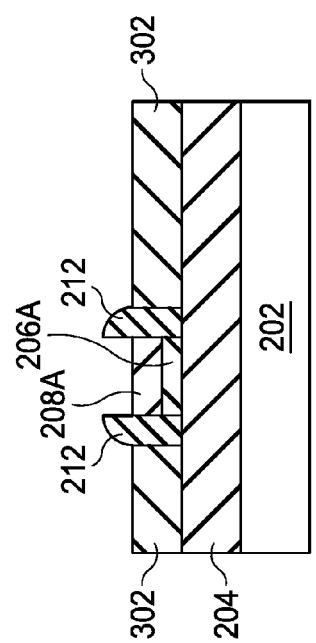

Referring now to FIG. 1, in step 104 a spacer-surrounding material layer is deposited onto the wafer 200. Such a step is illustrated in FIGS. 3A and 3B, in which a spacer-surrounding material layer 302 is depicted over the exposed surfaces of the target layer 204. FIG. 3A is a top view of the wafer 200, while FIG. 3B is a cross-sectional view as seen according to line 3-3 of FIG. 3A. The spacer-surrounding material layer 302 may be formed from the same material as the patterning layer feature 208A, such that the spacer-surrounding material layer 302 and the patterning layer feature 208A can be patterned jointly. For example, the spacer-surrounding material layer 302 may first be deposited over the target layer 204, the spacer 212, and the patterning layer feature 208A. Afterwards, an etch-back process is performed that exposes an upper portion of the spacer 212. Alternatively or additionally, a chemical-mechanical planarization (CMP) process may be performed to expose the spacer 212 and provide a more uniform height to the spacer-surrounding material layer 302 and the patterning layer feature 208A.

Figure 4A:
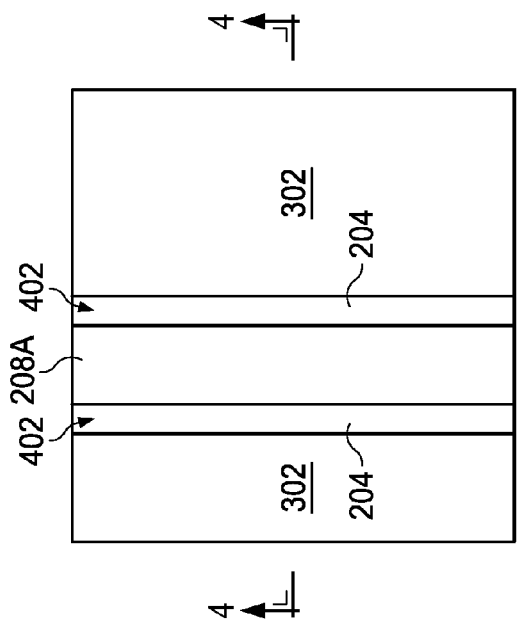
FIGS. 4A and 4B are a pair of fragmentary top view and fragmentary cross-sectional diagrams of a semiconductor substrate during processing according to the flowchart of FIG. 1.
Figure 4B:
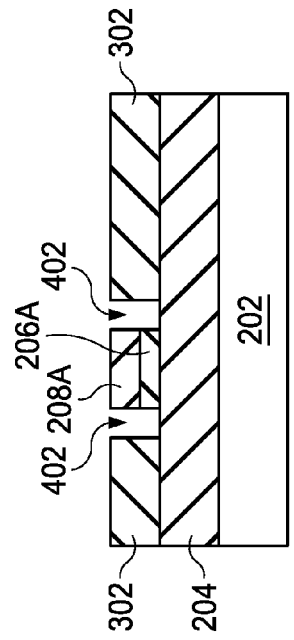

Referring again to the method 100 of FIG. 1, in step 106 the spacer is removed to form a fosse pattern in the spacer-surrounding material layer. An illustration of an embodiment of step 106 is seen in FIGS. 4A and 4B. FIG. 4A is a top view of the wafer 200, while FIG. 4B is a cross-sectional view as seen according to line 4-4 of FIG. 4A. In the illustrated embodiment, the spacer 212 is removed by a wet etch process, but in other embodiments a dry etch process may be used. A fosse pattern 402, defining a fosse or a moat, is formed between the spacer-surrounding material layer 302 on the outside and the patterning layer feature 208A and the hard mask feature 206A on the inside. The fosse pattern 402 includes a portion on either side of the line feature that includes the patterning layer feature 208A and the hard mask feature 206A. While the ends of the line feature formed by the patterning layer feature 208A and the hard mask feature 206A are not shown, the fosse pattern 402 may include undepicted portions at the ends of the line feature.

Figure 5C:
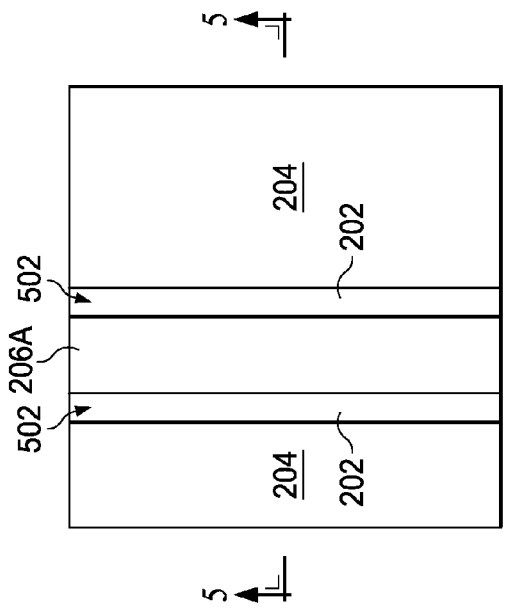
FIGS. 5A, 5B, 5C, and 5D are pairs of fragmentary top view and fragmentary cross-sectional diagrams of a semiconductor substrate during processing according to the flowchart of FIG. 1.
Figure 5D:
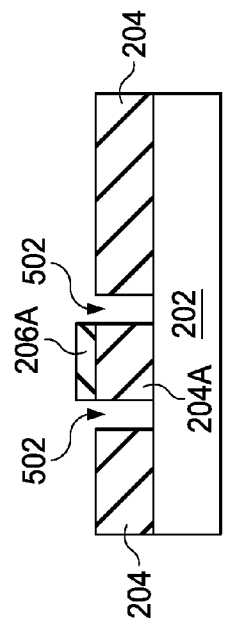
Figure 5A:
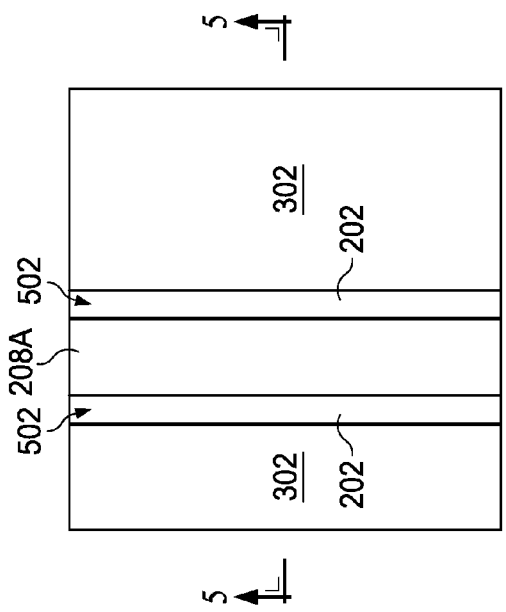
Figure 5B:
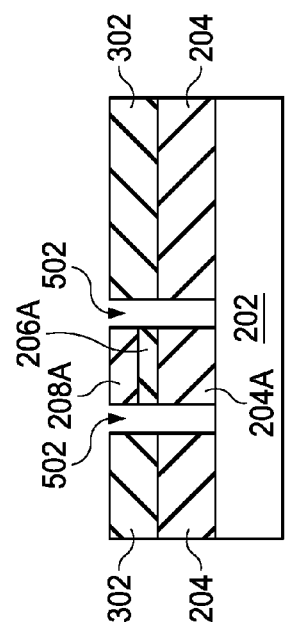

In method 100 as shown in FIG. 1, in step 108 an etching process is performed to etch the fosse pattern into the target layer to form a fosse feature. An embodiment is illustrated in FIGS. 5A, 5B, 5C, and 5D. FIG. 5A is a top view of the wafer 500 according to the etching process of step 108. FIG. 5B is a corresponding cross-sectional view as seen according to the line 5-5 of FIG. 5A. As seen in FIGS. 5A and 5B, the result of the etching process is that the fosse pattern 402 is transferred into the target layer 204 so that a fosse feature 502 is formed. The fosse feature 502 separates a first target layer feature 204A from a larger portion of the target layer 204 by a separation distance corresponding to a width of the fosse feature 502. This first target layer feature 204A corresponds to the first desired layout feature pattern of a desired layout as described above. The first target layer feature 204A may be referred to as a first desired layout feature.

After the fosse feature 502 is formed, the spacer-surrounding material layer 302 and the patterning layer feature 208A are removed. A result is illustrated in FIG. 5C in top view and in corresponding cross-sectional view in FIG. 5D. The cross-section of FIG. 5D shows FIG. 5C along the line 5-5. Thus, the target layer 204 is exposed, as are the portions of the substrate 202 defined by the fosse feature 502 and the hard mask feature 206A. As will be discussed later, the hard mask feature 206A serves as a protection layer, protecting the first target layer feature 204A in subsequent etching processes when forming more features into the target layer 204.

Returning to method 100 of FIG. 1, in step 110 a second desired layout feature pattern is patterned into the target layer. An embodiment of step 110 is seen in FIGS. 6A, 6B, 6C, 6D, 6E, 6F, 6G, 6H, 6I, 6J, 6K, 6L, 6M, and 6N. FIGS. 6A-N are a seven pairs of top and cross-sectional views of the wafer 200 during fabrication, with all of the cross-sectional views as seen along a line 6-6, illustrating the results of processes that may be performed as part of step 110. As in FIGS. 6A and 6B, the wafer 200 is prepared for additional patterning and processing by the deposition of an additional patterning layer 602 over the target layer 204, the exposed portions of the substrate 202 (those exposed by the fosse feature 502), and the hard mask feature 206A. Over the additional patterning layer 602, there is deposited an additional PR layer 604.

Figure 6C:
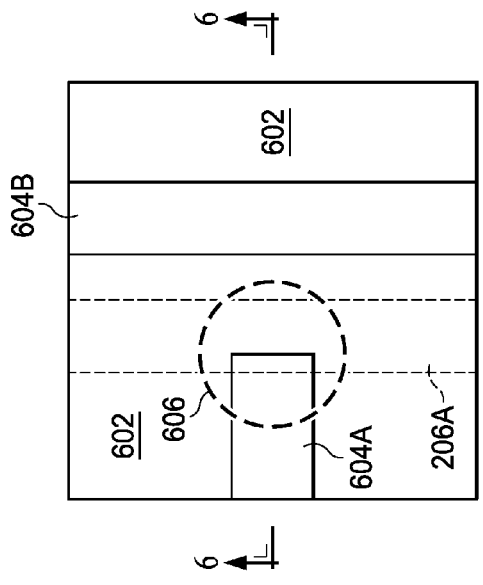
Figure 6D:
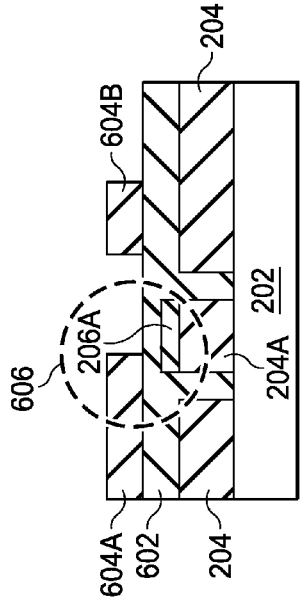
Figure 6A:
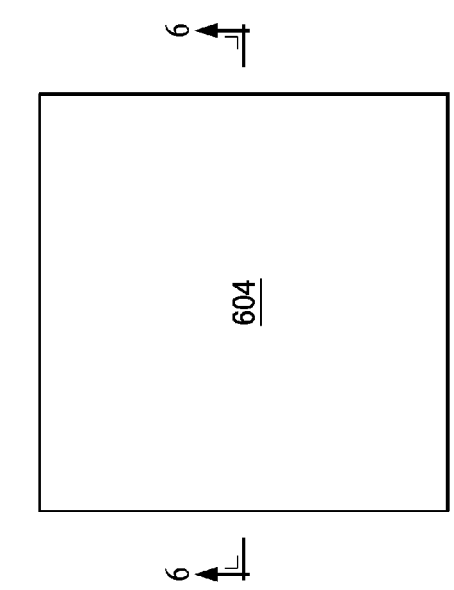
Figure 6B:
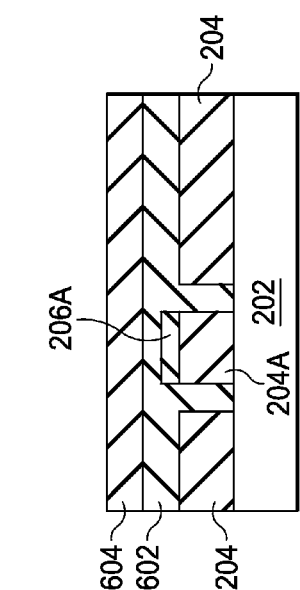

As seen in FIGS. 6C and 6D, the results of a photolithography step that uses a mask to transfer a second desired layout feature pattern into the PR layer 604 to form a PR feature 604A and another PR feature 604B. A region of interest 606 is circled in FIGS. 6C and 6D. The region of interest 606 illustrates the effect of an overlay error between the first and second masks used in the multiple lithography steps to produce the desired layout. In order to ensure proper functioning of the integrated circuit devices formed on wafer 200, certain tolerances are desirably maintained. Because of the fosse feature 502, the undesired extension of feature 604A over the target layer feature 204A in the region of interest 606 is prevented from impacting the target layer 204.

An etch process is performed using the PR features 604A and 604B as masking features to transfer the second desired layout feature pattern into the additional patterning layer 602. The result is illustrated in FIGS. 6E and 6F, which depicts the patterning layer features 602A and 602B. The etch process is a selective etch process that removes the exposed portions of the additional patterning layer 602, thereby exposing the target layer 204 and the hard mask feature 206A.

FIGS. 6G and 6H illustrate the wafer 200 after the PR features 604A and 604B are removed from over the patterning layer features 602A and 602B. This is performed by a wet etch process, but may also be performed by a selective dry etch process. The remaining hard mask feature 206A and the patterning layer features 602A and 602B serve as masks during a target layer removal/patterning process, the results of which are seen in top view in FIG. 6I and in corresponding cross-section in FIG. 6J. This processing step may remove a substantial portion of the target layer 204 as the second desired layout feature pattern is transferred to the target layer 204, forming a second target layer feature 204B beneath patterning layer feature 604A and a third target layer feature 204C beneath patterning layer feature 602B.

Figure 6M:
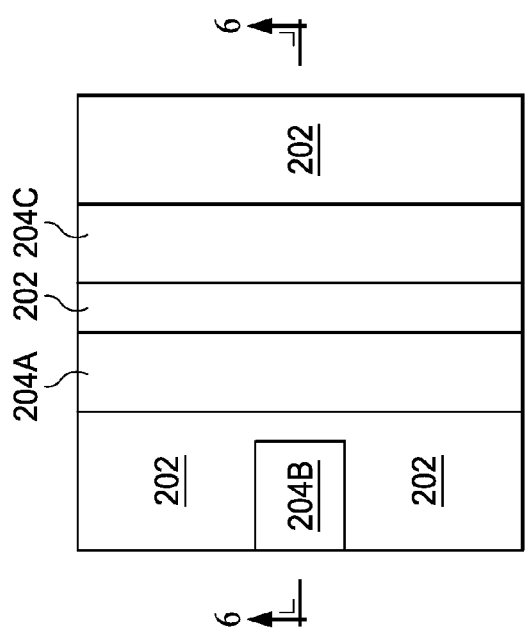
Figure 6N:
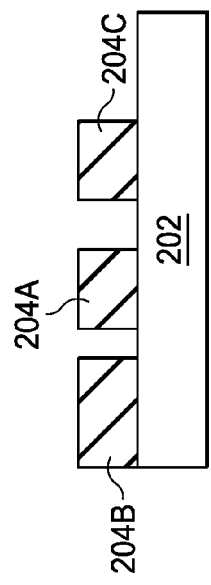

In FIGS. 6K and 6L, the results of an additional patterning layer removal process shows the exposed second and third target layer features 204B and 204C and the first target layer feature 204A with a remaining hard mask feature 206A thereon. Even though the second patterning feature 602A may have inadvertently extended over the first target layer feature 204A, because of the fosse feature 502 formed earlier, the second target layer feature 204B does not contact the first target layer feature 204A. Such an event could cause an integrated circuit device to fail. Thus, in the event of an overlay or other error, the second or third target layer feature may be shaped in part by the fosse feature 502. After the second desired layout feature or features are transferred into the target layer 204, the hard mask feature 206A is removed from over the first target layer feature 204A. This is shown in FIGS. 6M and 6N.

In the method 100, as described above, the fosse feature 502 ensures that a required separation, determined by the dimensions of the spacer 212, is maintain even in the event of overlay error between the sub-layouts of the desired layout. When more than one sub-layout is used to create a designed pattern in a target layer, like that formed by first, second, and third target layer features 204A, 204B, and 204C, ensuring proper separation can be crucial to forming functioning devices. Thus, the fosse feature 502 may prevent unwanted interactions between submasks in a multiple lithography process and may improve integrated circuit device yields and performance.

Figure 7:
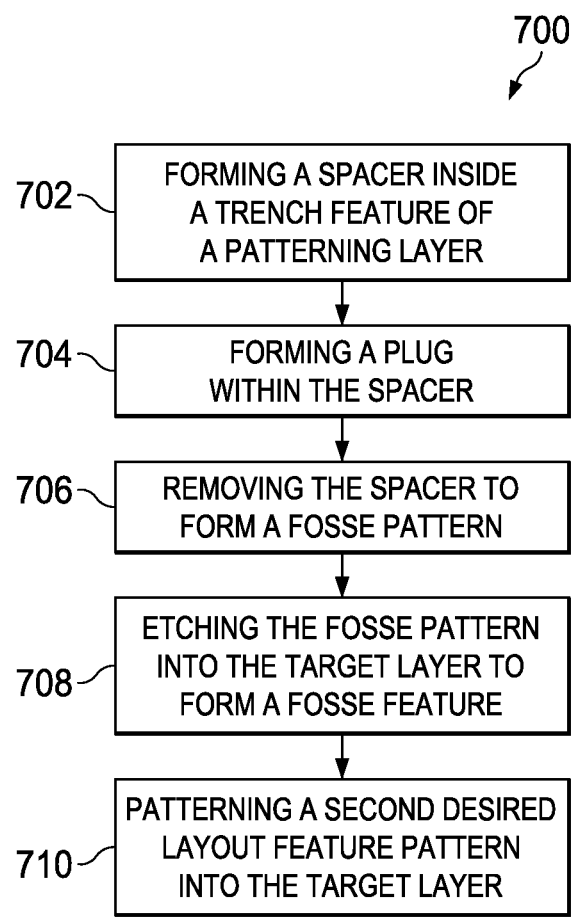
FIG. 7 is a flowchart of a method for transferring a desired layout into a target layer on a semiconductor substrate.

FIG. 7 is a flowchart of a method 700 for transferring a desired layout into a target layer on a semiconductor substrate. Like the method 100, method 700 is illustrated as included several enumerated steps. However, embodiments of the method 700 may include additional steps before, after, and in between the enumerate steps. Additional any given enumerated steps may include a number of addition steps. To more clearly describe at least one embodiment of the method 100 reference is made in discussing steps 702-710 to additional figures, including FIGS. 8A-8H, 9A-D, 10A-B, 11A-D, and 12A-T. The method 700 begins in step 702 in which a spacer is formed inside a trench feature formed in a patterning layer. Step 702 may be better understood by reference to FIGS. 8A, 8B, 8C, 8D, 8E, 8F, 8G, and 8H, which are corresponding pairs of top and cross-sectional views of a wafer 800 during a number of processing steps.

Figure 8C:
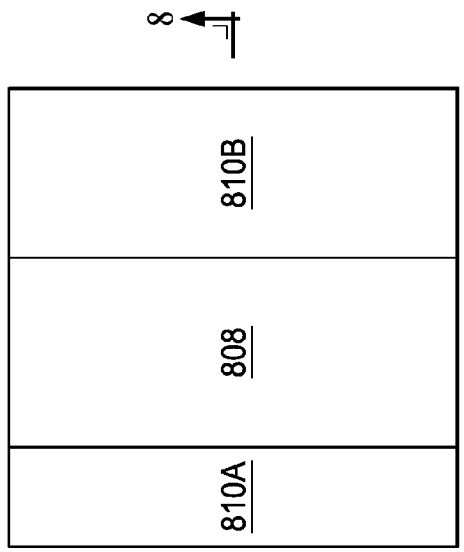
Figure 8A:
Figure 8D:
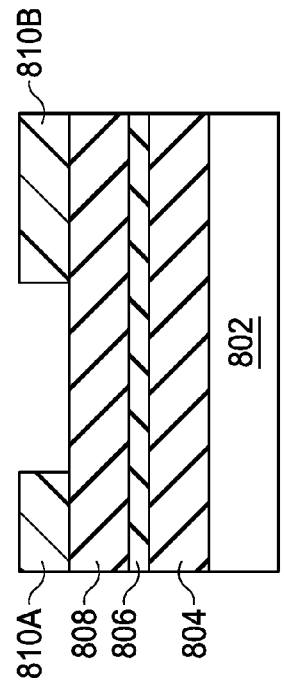
Figure 8B:
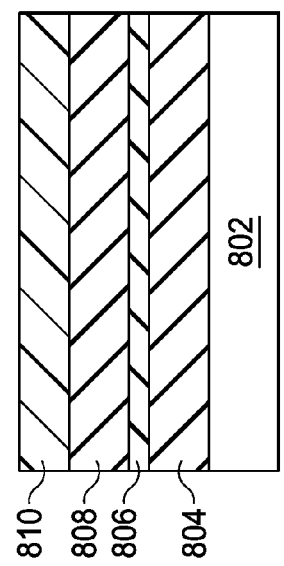

Thus, FIG. 8A is a top view of the wafer 800, only a fragment of which is depicted, and FIG. 8B is a cross-sectional view along the line 8-8 of FIG. 8A. As seen in FIG. 8B, the wafer 800 includes a substrate 802, which is similar to the substrate 202 described above. Over the substrate 802, there is a target layer 804 with a hard mask layer 806 and a patterning layer 808 above it. Over the patterning layer is a PR layer 810. This PR layer 810 is also seen in FIG. 8A.

In FIGS. 8C and 8D, a portion of the PR layer 810 is exposed to (or shielded from) a photolithography light source to selectively remove the portion. As illustrated, this forms a PR feature 810A and another PR feature 810B. Between the features 810A and 810B, a portion of the patterning layer 808 is exposed. Shown in FIGS. 8E and 8F are the results of an etching process that removes the exposed portion of the patterning layer 808, thus forming a trench 814. After the formation of the trench 814, the remaining portions of the PR layer 810, PR features 810A and 810B, are removed. A spacer material layer is then deposited over the wafer 800 and patterned to form the spacer 816 within the trench 814. Patterning the spacer 816 may be done with an etching process and a CMP process. The spacer 816 is formed such that it has a central opening 818 in which the hard mask layer 806 is exposed.

Figure 9C:
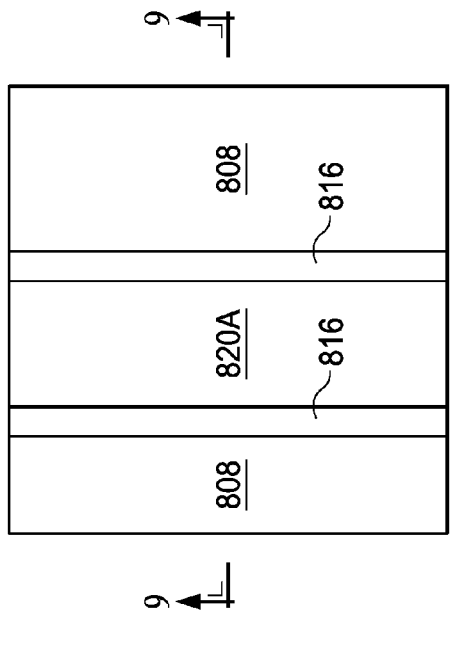
FIGS. 9A, 9B, 9C, and 9D are pairs of fragmentary top view and fragmentary cross-sectional diagrams of a semiconductor substrate during processing according to the flowchart of FIG. 7.
Figure 9D:
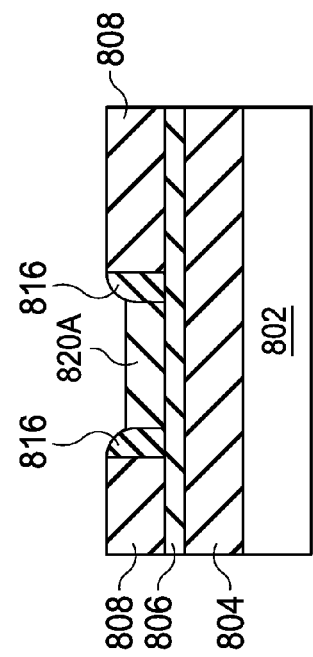
Figure 9A:
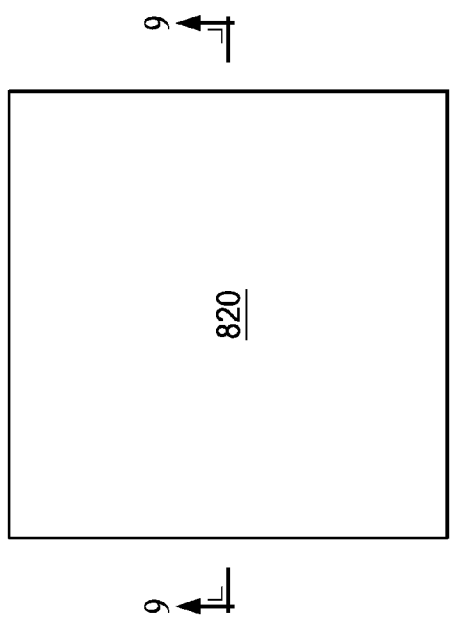
Figure 9B:
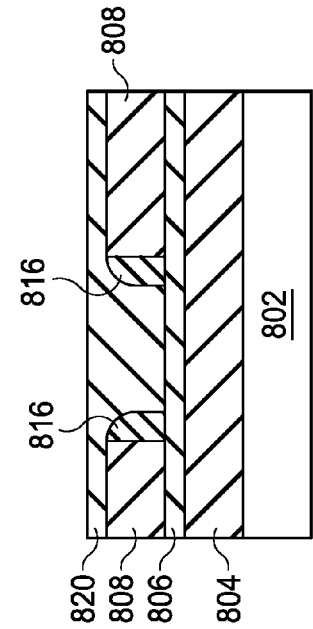

Returning to method 700 of FIG. 7, in step 704, a plug is formed within the spacer. As illustrated in FIGS. 9A and 9B, a plug material layer 820 is deposited over the wafer 800, or over the PR layer 810, the spacer 816, and the exposed portion of the hard mask layer 806 in the opening 818. While only the plug material layer 820 is visible in the top view of FIG. 9A, the cross-sectional view in FIG. 9B showing wafer 800 along a line 9-9 provides more visual detail. The plug material layer 820 is patterned by an etch-back process and/or a CMP process to remove portions of the plug material layer 820 that are over the patterning layer 808 and the spacer 816, thereby forming plug 820A. This is depicted in top view in FIG. 9C and in a corresponding cross-sectional view in FIG. 9D.

In method 700 of FIG. 7, in step 706 the spacer is removed to form a fosse pattern. This is seen in FIGS. 10A and 10B. As shown in FIG. 10A in top view and cross-sectionally in FIG. 10B, the spacer 816 is removed from the trench 814, leaving the plug 820A and forming a fosse pattern 822 that includes a fosse or moat feature on both the illustrated sides of the plug 820A. That may be done by a wet etch in the illustrated embodiment, or by a dry etch process.

In step 708 of the method 700, the fosse pattern is etched into the target layer to form a fosse feature. An embodiment of step 708 is illustrated in FIGS. 11A, 11B, 11C, and 11D. As shown in FIG. 11A and in the corresponding cross-sectional view of FIG. 11B, the patterning layer 808 and the plug 820A are used as a masking layer to etch through the hard mask layer 806 and the target layer 808. The hard mask layer 806 and the target layer 804 are patterned with two different etching processes in the depicted embodiment, but a single etch process may also be used to pattern both layers in some other embodiments. As illustrated in FIGS. 11C and 11D, after the exposed portions of the hard mask layer 806 and the afterward exposed portions of the target layer 804, the remaining portions of the patterning layer 808 are removed, as well as the plug 820A. Thus, the fosse patterned 822 is etched into the target layer 804 to form a fosse feature 824, having a target feature 804A in its center. The target feature 804A is underneath a hard mask feature 806A. As will be discussed later, the hard mask feature 806A serves as a protection layer, protecting the target feature 804A in subsequent etching processes when forming more features into the target layer 804.

In step 710 of the method 700, a second desired layout feature pattern is patterned to transfer into the target layer. An embodiment of step 710 is illustrated in FIGS. 12A-T, which depict a number of processing steps that may be performed in step 710. As illustrated in top view FIG. 12A and in cross-section in FIG. 12B, after the fosse feature 824 is formed, an additional patterning layer 826 is formed over the wafer 800, and then an additional PR layer 828 is deposited thereover. FIG. 12A is a cross-section of wafer 800 as seen in FIG. 12B according to the line 12-12. FIGS. 12C and 12D depict the result of a photolithographic patterning process using a mask that includes a sub-layout of the desired layout. The patterned PR layer 828 includes openings 830A and 830B that expose the additional patterning layer 826. The openings 830A and 830B correspond to the second desired layout feature pattern. FIGS. 12C and 12D both include a circled region of interest 832. The circled region of interest 832 highlights an overlay error that causes a portion of the opening 830A to overlay both the fosse feature 824 and a portion of the hard mask feature 806A and the target layer feature 804A. As is more apparent in later figures, because of the fosse feature 824, the overlay error may be prevented from causing an undesired connection between features of a desired layout when decomposed into multiple sub-layouts.

Figure 12E:
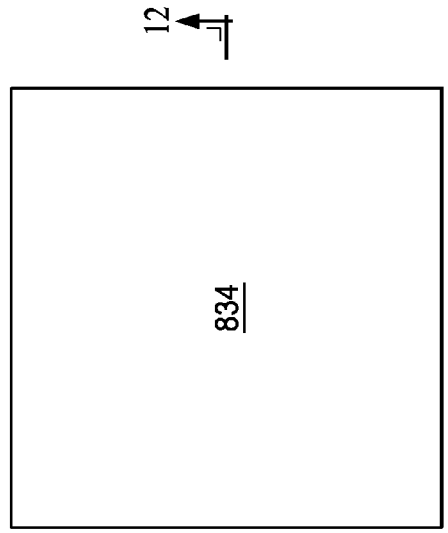
Figure 12F:
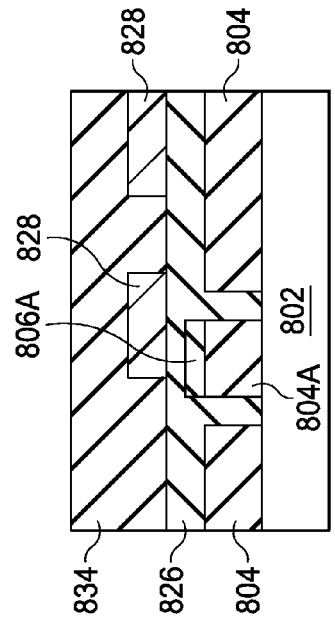
Figure 12C:
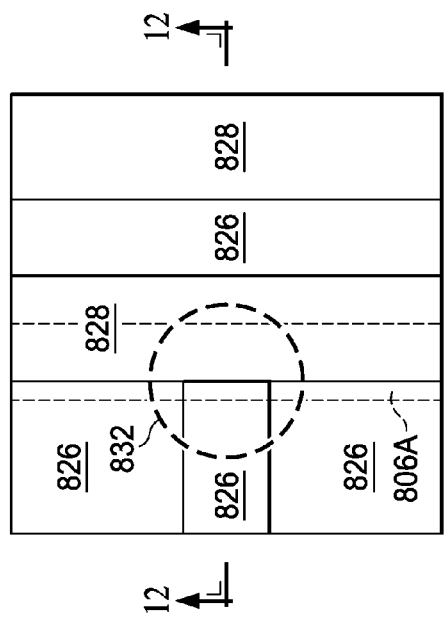
Figure 12D:
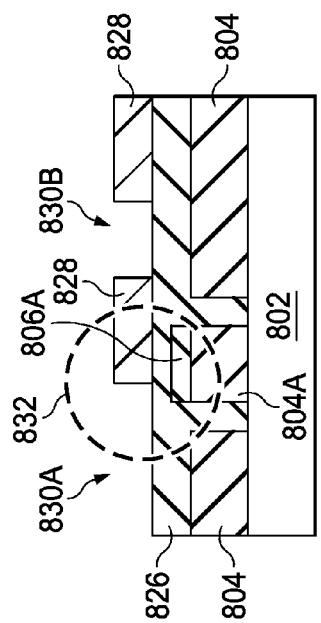

FIGS. 12E and 12F illustrate a result of the formation of an additional plug material layer 834 over the additional patterned PR layer 828 and the portions of the additional patterning layer 826 exposed by the openings 830A and 830B in the patterned PR layer 828. An etch-back and/or CMP process is used to remove the portions of the additional plug material layer 834 from off of the patterned PR layer 828, thus re-exposing the patterned PR layer 828. This is seen in FIG. 12G and in cross-section in FIG. 12H. Thus, the additional plug material layer 834 is patterned to form a first plug 834A and a second plug 834B. FIGS. 12I and 12J illustrate the removal of the patterning PR layer 828, leaving behind the first plug 834A and the second plug 834B that serve as masking features in order to pattern underlying layers, like the additional patterning layer 826.

Figure 12Q:
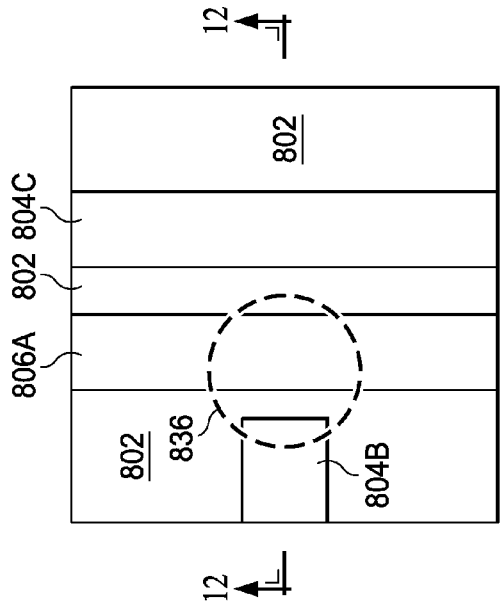
Figure 12R:
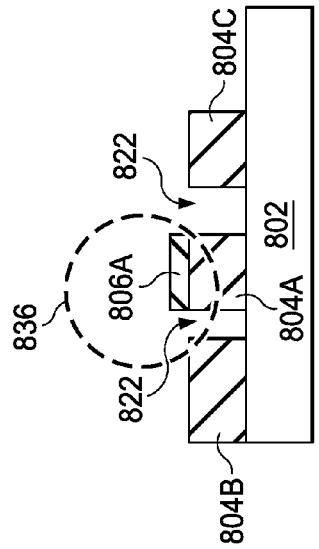
Figure 12O:
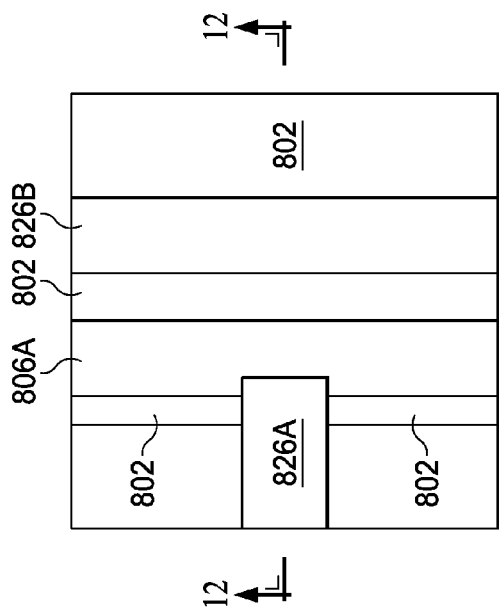
Figure 12P:
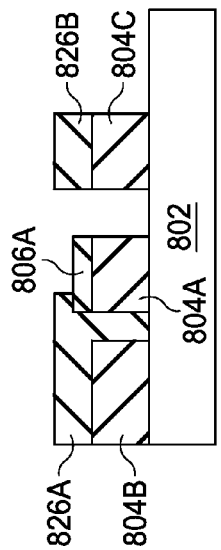
Figure 12S:
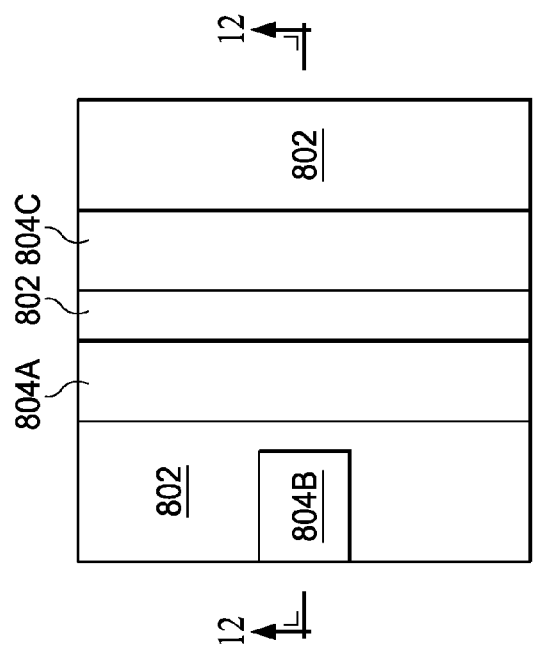
Figure 12T:
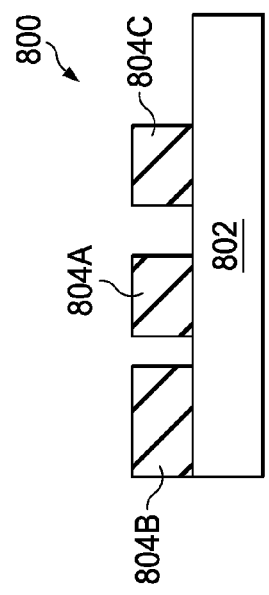

In general, the subsequent processing steps that may be included in step 710 are similar to those illustrated in FIGS. 6C-N described above in connection with the method 100 of FIG. 1. As seen in FIGS. 12K and 12L, an etch process is performed to remove the exposed portions of the additional patterning layer 826 to form additional patterning features 826A and 826B, underneath the first plug 834A and the second plug 834B, respectively. This etch process exposes portions of the hard mask feature 806A, the target layer 804, and the substrate 802. The plugs 834A and 834B are removed as illustrated in FIGS. 12M and 12N. An etch process is used to remove exposed portions of the target layer 804, thereby forming target features 804B and 804C as shown in FIGS. 12O and 12P. The patterning feature 826A and 826B are subsequently removed by a wet or dry etch process to uncover the target feature 804B and 804C. This is shown in FIGS. 12Q and 12R, which also include a circled region of interest 836. The circled region of interest 836 highlights effects of the fosse feature 822 in maintaining a desired minimum separation distance between the target features 804B and 804A. In this instance a separation distance between the target features 804A and 804C is greater than the minimum separation distance provided by the width of the spacer 816 and the corresponding fosse feature 822. Thus, the fosse feature 822 facilitates the use of multiple sub-layouts to form a single desired layout in the target layer 804, but mitigating problems caused by imperfect alignment of the sub-layouts.

After the patterning features 826A and 826B are removed, the remaining hard mask feature 806A is also removed by an etch process, thereby leaving only the target features 804A-C over the substrate 802.

Figure 13:
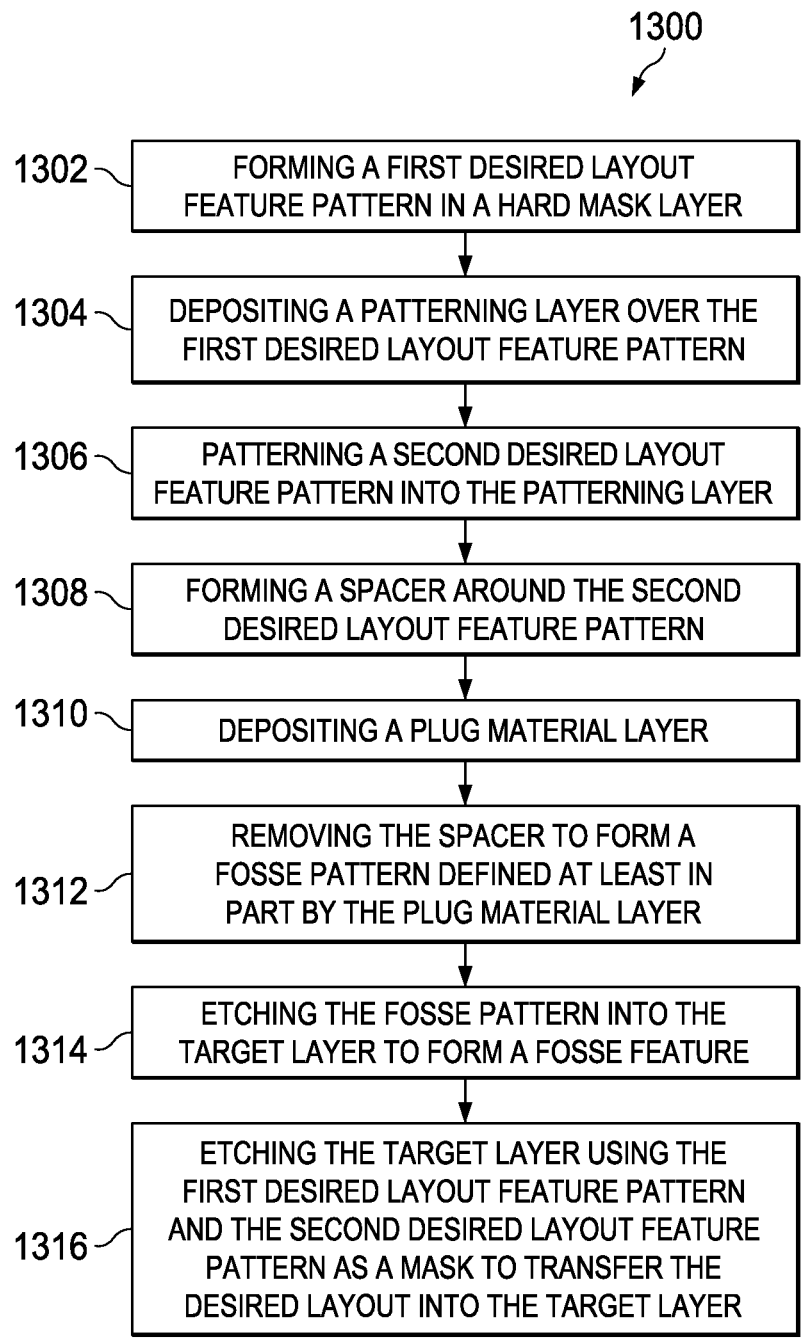
FIG. 13 is a flowchart of a method for transferring a desired layout into a target layer on a semiconductor substrate.

FIG. 13 is a flowchart of a method 1300 for transferring a desired layout into a target layer on a semiconductor substrate. The method 1300 includes a number of enumerated steps, but embodiments of the method 1300 may include additional steps before, after, and/or in between the enumerated steps. To more clearly describe at least one embodiment of the method 1300, reference is made in discussing steps 1302-1316 to additional figures including FIGS. 14A-F, 15A-B, 16A-D, 17A-B, 18A-B, 19A-F, 20A-D, and 21A-D. Method 1300 may begin in step 1302 in which a first desired layout feature pattern is formed in a hard mask layer. An embodiment of step 1302 is provided in FIGS. 14A-F. FIGS. 14A and 14B illustrate a fragment of a wafer 1400 with a plurality of layers thereon. FIG. 14A is a top view of the wafer 1400, while FIG. 14B is a cross-section as seen along line 14-14 of FIG. 4A. As seen in FIG. 14B, the wafer 1400 includes a substrate 1402, which is similar to the substrates 202 and 802 described above. Over the substrate 1402, there is a target layer 1404 with a hard mask layer 1406 and a patterning layer 1408 above it. Over the patterning layer 1408 is a PR layer 1410. This PR layer 1410 is also seen in top view in FIG. 8A.

Figure 14C:
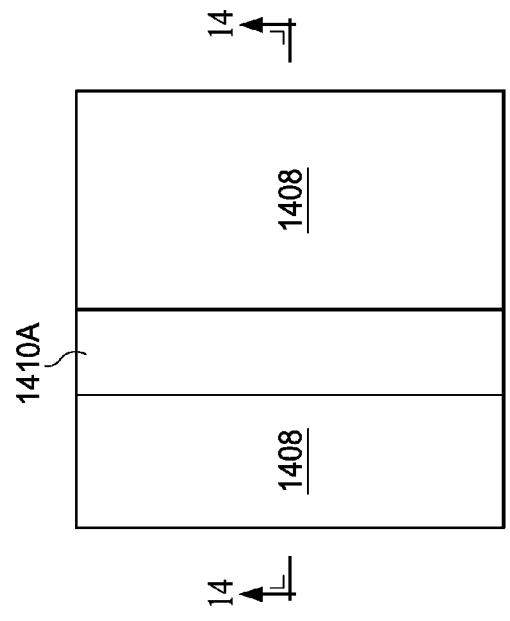
Figure 14D:
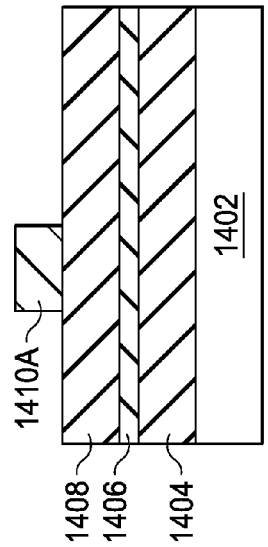
Figure 14A:
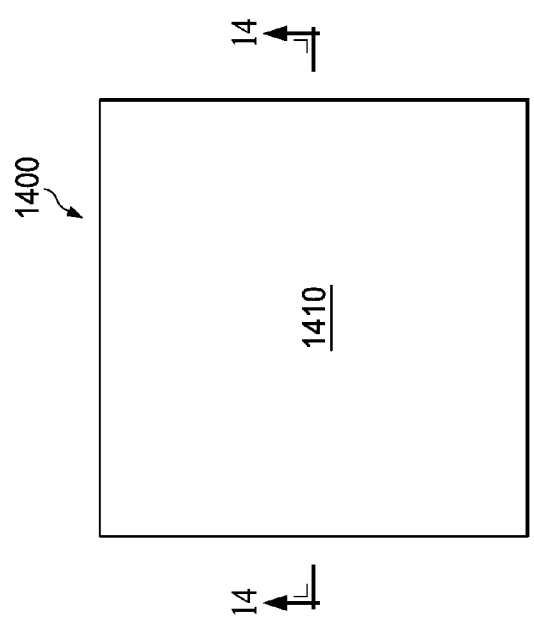
Figure 14B:
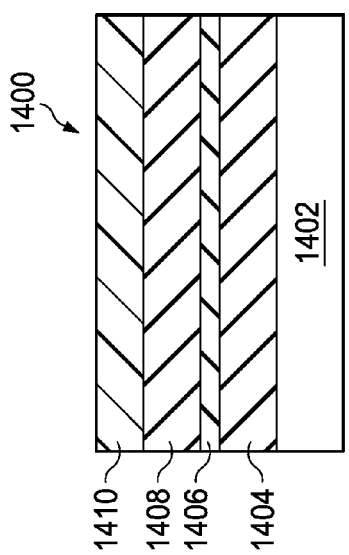

As seen in FIGS. 14C and 14D, the PR layer 1410 is patterned by a photolithographic process using a first sub-layout of the desired layout. The desired layout is decomposed into at least two sub-layouts with corresponding masks for use in patterning wafer 1400. Thus, the PR layer 1410 is patterned to form a first desired layout feature pattern, PR feature 1410A, over the patterning layer 1408. As seen in FIGS. 14E and 14F, the PR feature 1410A is used as etch mask to patterning underlying layers, thereby transferring the first desired layout feature pattern in the hard mask layer 1406 to form a hard mask feature 1406A. This may be performed in a single etch process or in more than one etch process.

Returning to method 1300 of FIG. 13, the method 1300 includes a step 1304 in which a patterning layer is deposited over the first desired layout feature pattern. An embodiment is seen in FIG. 15A in top view, and cross-sectionally in FIG. 15B, which is seen as along a line 15-15 of FIG. 15A. FIGS. 15A and 15B illustrate an additional patterning layer 1412 formed over the hard mask feature 1406A and the target layer 1404. An additional PR layer 1414 is formed over the additional patterning layer 1412.

Figure 16A:
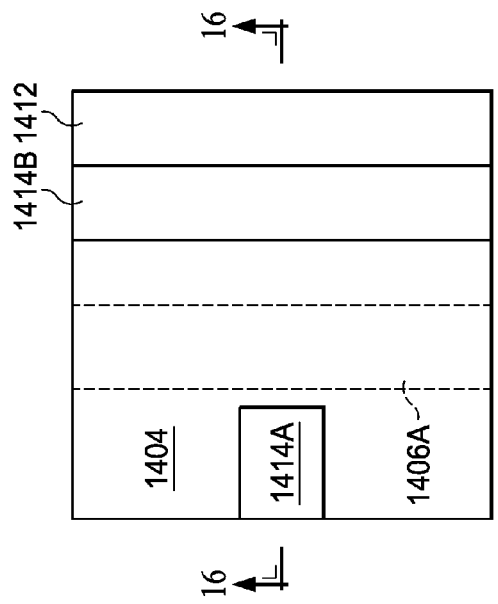
FIGS. 16A, 16B, 16C, and 16D are pairs of fragmentary top view and fragmentary cross-sectional diagrams of a semiconductor substrate during processing according to the flowchart of FIG. 13.
Figure 16B:
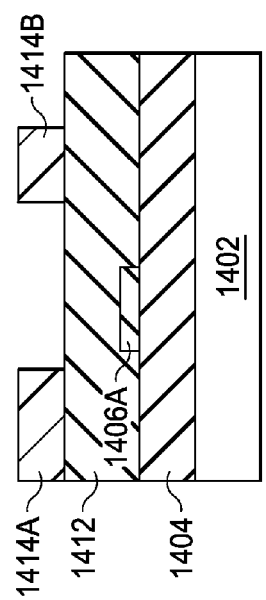
Figure 16C:
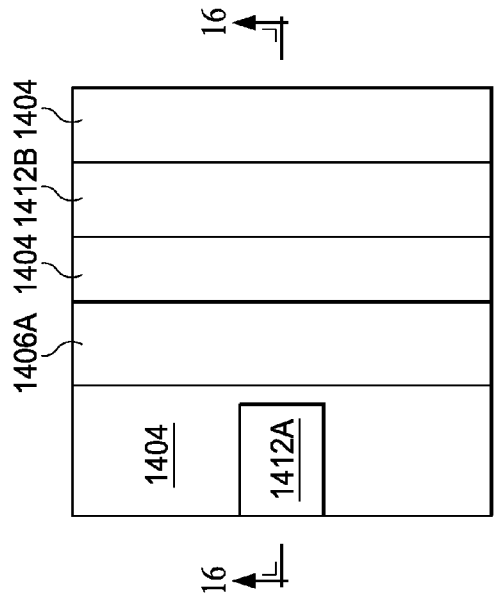
Figure 16D:
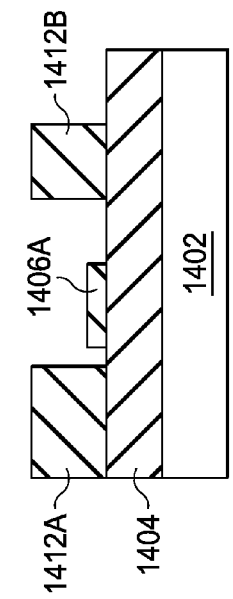

In step 1306 of the method 1300, a second desired layout feature pattern is patterned into the patterning layer. As shown in FIGS. 16A and 16B, a second sub-layout is used to photolithographically pattern the additional PR layer 1414 to form a first PR feature 1414A and a second PR feature 1414B. An etching process is used to transfer the geometries of the PR features 1414A and 1414B into the underlying additional patterning layer 1412 to form patterning features 1412A and 1412B. The etching of the additional patterning layer 1412 exposes the hard mask feature 1406A and portions of the target layer 1404.

Figure 17A:
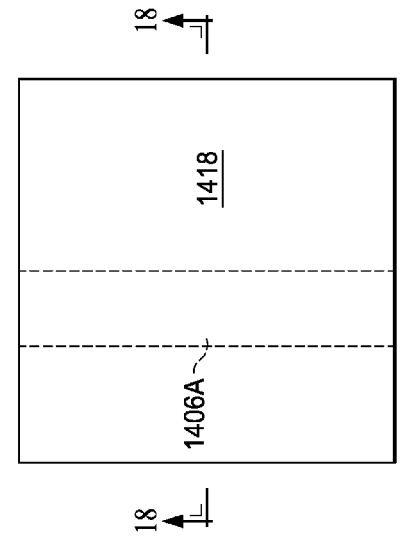
FIGS. 17A and 17B are a pair of fragmentary top view and fragmentary cross-sectional diagrams of a semiconductor substrate during processing according to the flowchart of FIG. 13.
Figure 17B:
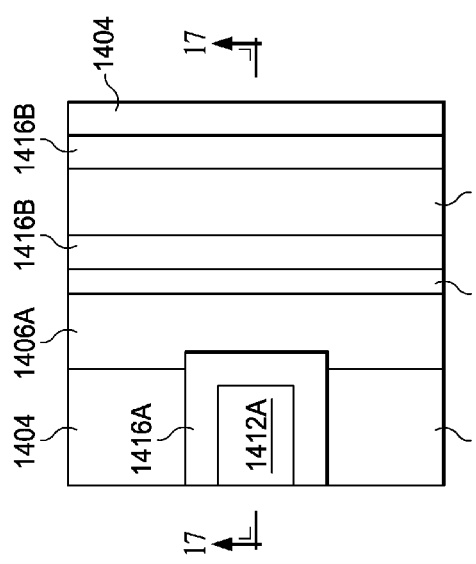
Figure 18B:
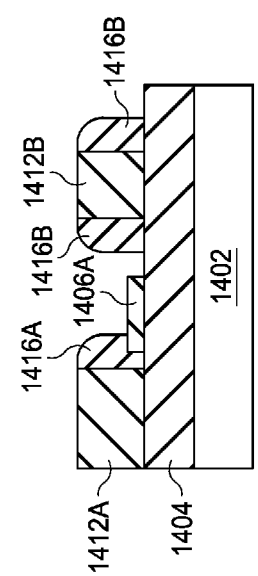

In step 1308 of the method 1300, a spacer is formed around the second desired layout feature pattern. An embodiment of step 1308 is seen in FIGS. 17A and 17B which show a spacer 1416A around the patterning feature 1412A and a spacer 1416B around the patterning feature 1412B. The spacers 1416A and 1416B are formed such that they have a constant width, which may provide a minimum separation distance between features defined by the patterning features 1412A and 1412B. Due to an overlay error, or as permitted by a design rule check system, the spacer 1416A overlies a portion of the hard mask feature 1406A.

Figure 18A:
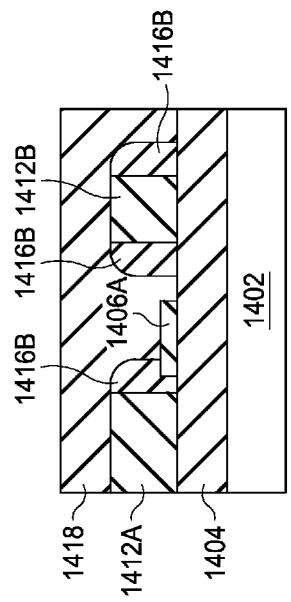
FIGS. 18A and 18B are a pair of fragmentary top view and fragmentary cross-sectional diagrams of a semiconductor substrate during processing according to the flowchart of FIG. 13.

In step 1310 of the method 1300, a plug material layer is deposited over the substrate and onto the exposed features and layers thereon. As shown in FIG. 18A and in corresponding cross-sectional view in FIG. 18B, a plug material layer 1418 is deposited over the wafer 1400. The plug material layer 1418 is illustrated in contact with the patterning features 1412A and 1412B, with the spacers 1416A and 1416B, and with the hard mask feature 1406A and exposed portions of the target layer 1404.

In step 1312 of the method 1300 as shown in FIG. 13, a spacer is removed to form a fosse pattern defined at least in part by the plug material layer. As shown in FIG. 19A and the corresponding cross-sectional view of FIG. 19B, the plug material layer 1418 is etched back so that the plug material layer portions that are over the patterning features 1412A and 1412B and the spacers 1416A and 1416B are exposed. The portions of the plug material layer 1418 that are over the target layer 1404 and the hard mask feature 1406A (specifically, the portion thereof that does not have a spacer over it) are left behind by the etch back process.

Figure 19E:
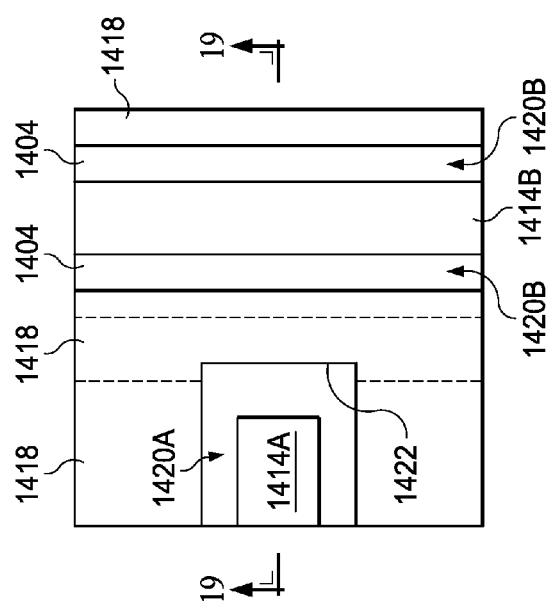
Figure 19F:
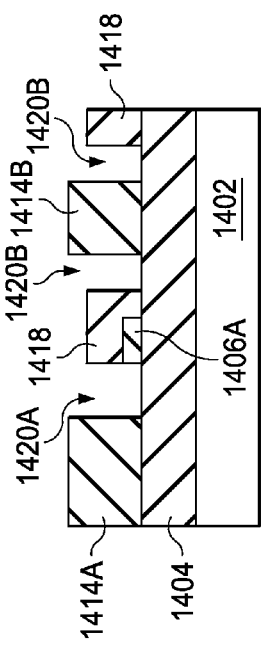

After the etch back of the plug material layer 1418, an etch process removes the spacers 1416A and 1416B, thereby exposing the underlying target layer 1404 and a portion of the hard mask feature 1406A, and forming a fosse pattern 1420A and another fosse pattern 1420B. The fosse pattern 1420A is situated around the patterning feature 1414A, while the fosse pattern 1420B is situated around the patterning feature 1414B. This is shown in FIGS. 19C and 19D. Because of an overlap between the first desired layout feature pattern and the second desired layout feature pattern, the portion of the hard mask feature 1406A that is exposed is in the fosse pattern 1420A. In order to ensure the minimum desired separation distance, an additional etch process is performed to remove the exposed hard mask feature 1406A in the area defined by the fosse pattern 1420A. This additional etch process forms a fosse-pattern notch 1422 in the hard mask feature 1406A, as in illustrated in FIGS. 19E and 19F.

Figure 20A:
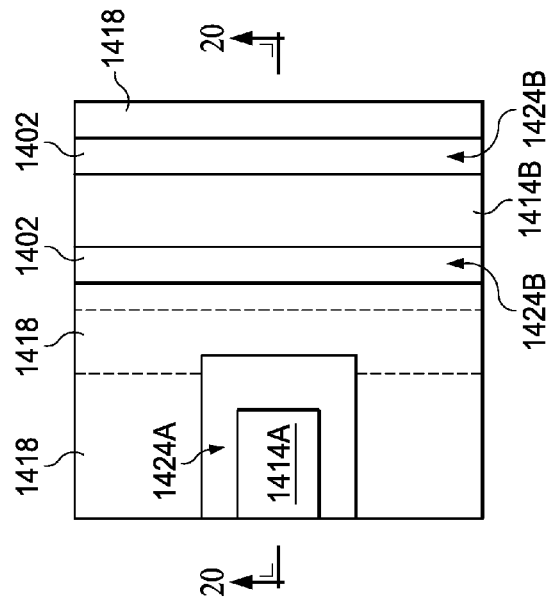
FIGS. 20A, 20B, 20C, and 20D are pairs of fragmentary top view and fragmentary cross-sectional diagrams of a semiconductor substrate during processing according to the flowchart of FIG. 13.
Figure 20B:
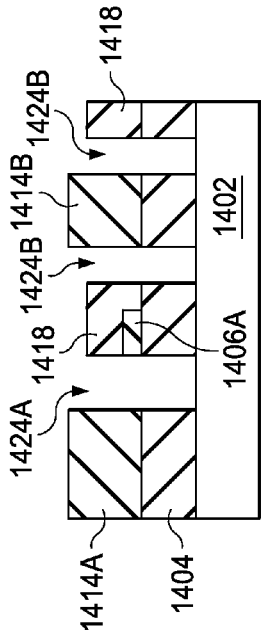
Figure 20C:
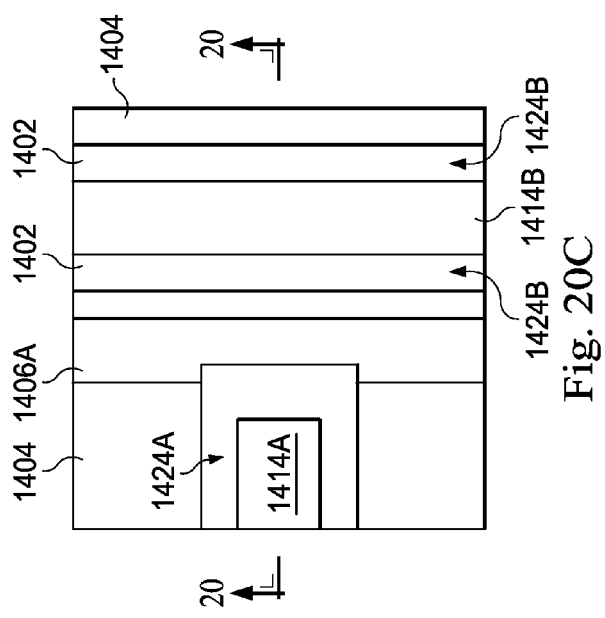
Figure 20D:
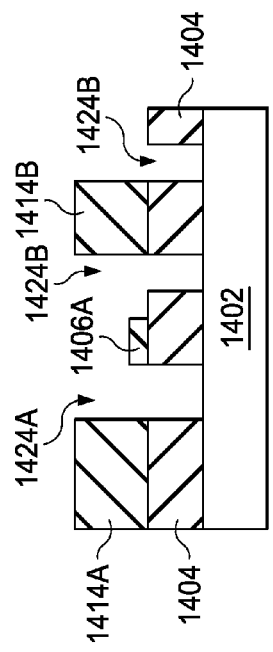

Returning to FIG. 13 and to the method 1300, a step 1314 includes etching the fosse pattern into the target layer to form a fosse feature. An embodiment is illustrated in FIGS. 20A and 20B, showing the result of an etch process performed on the wafer 1400 that removes the portions of the target layer 1404 that are exposed by the fosse patterns 1420A and 1420B. The etch process transfers the fosse patterns 1420A and 1420B into the target layer 1404 to form fosse features 1424A and 1424B. Subsequently, the remaining portions of the plug material layer 1418 are removed by a selective etch process. This result is seen in FIGS. 20C and 20D.

Figure 21A:
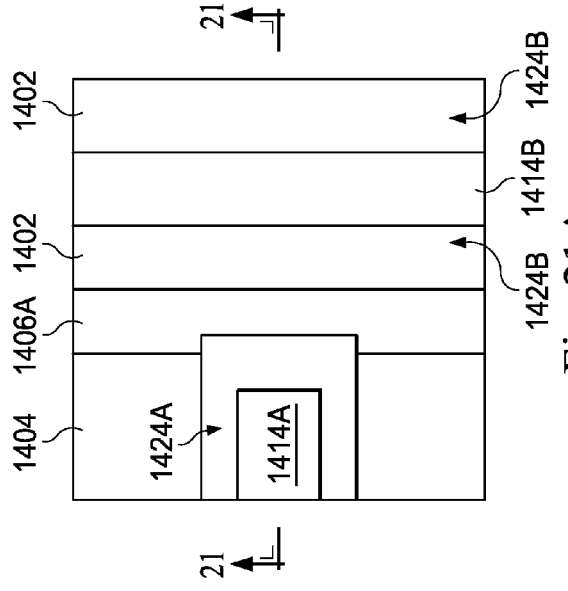
Figure 21B:
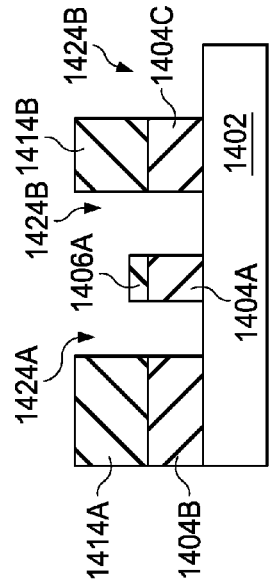

In step 1316 of method 1300, the target layer is etched using the first desired layout feature pattern and the second desired layout feature pattern as a mask to transfer the desired layout into the target layer. An embodiment is illustrated in FIGS. 21A-D. In FIGS. 21A and 21B, which is a cross-sectional along line 21-21 of FIG. 21A, the patterning features 1414A and 1414B and the hard mask feature 1406A, with its fosse-pattern notch 1422, are used as an etch mask during an etch process to remove the exposed portions of the target layer 1404. Afterwards, the patterning features 1414A and 1414B and the hard mask feature 1406A are removed by one or more etch processes.

The result as seen in FIGS. 21C and 21D is that the substrate 1402 of wafer 1400 has target features 1404A, 1404B, and 1404C thereon. The features 1404A-C result from the use of two desired layout feature patterns which share features of a desired layout. The fosse patterns 1420A and 1420B formed around features according to the second desired layout feature pattern make this second desired layout feature pattern dominant over the first desired layout feature pattern, such that the fosse-pattern notch 1422 modifies the first desired layout feature pattern. In some embodiments, the first desired layout feature pattern may be dominant over the first.

The three methods described herein, methods 100, 700 and 1300 provide a self-aligned, multiple lithography process to ensure that minimum separation distances between features of one sub-layout are kept between features of another sub-layout. Methods 100, 700, and 1300 may include embodiments in which more than two sub-layouts are used to transfer a single desired layout into a target material layer. Because the separation distance is enforced by the process, overlay errors and other alignment errors may be mitigated. The yield of wafers fabricated according to methods 100, 700, and 1300 may be higher and have more consistently performing semiconductor devices thereon.

In one exemplary aspect, the present disclosure describes a method for transferring a desired layout into a target layer on a semiconductor substrate. The method includes forming a first desired layout feature as a first line over the target layer; forming a spacer around the first line; and depositing a spacer-surrounding material layer, the spacer-surrounding material layer surrounding the spacer. The method further includes removing the spacer to form a fosse pattern trench surrounding the first line; and transferring the fosse pattern trench into the target layer to form a fosse feature trench in the target layer, wherein the fosse feature trench surrounds a first portion of the target layer that is underneath a protection layer.

In another exemplary aspect, the present disclosure describes a method for forming a target pattern into a target layer on a semiconductor substrate, wherein the target pattern includes a first line and a second line. The method includes forming a first patterning layer over the target layer; patterning the first patterning layer to form a first trench; forming a spacer on sidewalls of the first trench; and forming a first plug within the spacer, wherein dimensions of the first plug substantially match those of the first line from a top view. The method further includes removing the spacer to form a fosse surrounding the first plug; and etching the target layer through the fosse thereby forming a fosse feature into the target layer, wherein the fosse feature surrounds a first portion of the target layer that is underneath a protection layer, and the first portion of the target layer forms the first line of the target pattern.

In an additional exemplary aspect, the present disclosure describes a method of patterning a target layer on a semiconductor substrate. The method includes forming first patterns in a hard mask layer that is over the target layer; depositing a patterning layer over the first patterns and over the target layer; forming second patterns into the patterning layer; forming spacers around the second patterns; filling spaces between spacers with a plug material layer; removing the spacers to form a fosse pattern defined at least in part by the plug material layer; etching the fosse pattern into the target layer to form a fosse feature; and etching the target layer using the first patterns and the second patterns as an etch mask thereby forming a pattern into the target layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for transferring a desired layout into a target layer on a semiconductor substrate, the method comprising:
    forming a first desired layout feature as a first line over the target layer, wherein the first line includes a patterning layer portion over a hard mask layer portion;
    forming a spacer around the first line;
    depositing a spacer-surrounding material layer, the spacer-surrounding material layer surrounding the spacer and at least a portion of the first desired layout feature as the first line;
    removing the spacer to form a fosse pattern trench surrounding the first line; and
    transferring the fosse pattern trench into the target layer to form a fosse feature trench in the target layer, wherein the fosse feature trench surrounds a first portion of the target layer that is underneath a protection layer, and wherein transferring the fosse pattern trench into the target layer includes removing the spacer-surrounding material layer and the patterning layer portion thereby leaving the hard mask layer portion as the protection layer over the first portion of the target layer.

2. The method of claim 1, wherein the patterning layer portion and the spacer-surrounding material layer are formed from the same material, and further comprising:
    before removing the spacer, performing an etch-back process on the spacer-surrounding material layer and the patterning layer portion thereby exposing the spacer.

3. The method of claim 1, further comprising patterning a second desired layout feature into the target layer that includes:
    depositing a patterning layer over the semiconductor substrate, the target layer, and the protection layer;
    forming a photoresist layer over the patterning layer;
    patterning the photoresist layer with the second desired layout feature as a second line;
    etching the patterning layer with the second line as an etch mask thereby forming a patterned patterning layer; and
    etching the target layer with the patterned patterning layer and the protection layer as an etch mask.

4. The method of claim 1, further comprising removing the first desired layout feature as the first line after transferring the fosse pattern trench into the target layer to form a fosse feature trench in the target layer.

5. The method of claim 1, further comprising:
    forming another patterning layer over the target layer and within the fosse feature trench; and
    patterning the target layer by using the another patterning layer as an etch mask.

6. The method of claim 5, wherein forming the another patterning layer over the target layer and within the fosse feature trench includes forming the another patterning layer directly on the hard mask layer portion.

7. A method for patterning a target layer on a semiconductor substrate, the method comprising:
    forming a first line, a spacer, and a first material layer over the target layer, wherein the spacer surrounds the first line, and the first material layer surrounds the spacer;
    removing the spacer to form a fosse pattern trench surrounding the first line;
    transferring the fosse pattern trench into the target layer to form a fosse feature trench in the target layer, wherein the fosse feature trench surrounds a first portion of the target layer that is underneath a protection layer;
    depositing a patterning layer over the semiconductor substrate, the target layer, and the protection layer;
    forming a photoresist layer over the patterning layer;
    patterning the photoresist layer to form a second line;
    etching the patterning layer with the second line as an etch mask thereby forming a patterned patterning layer; and
    etching the target layer with the patterned patterning layer and the protection layer as an etch mask.

8. The method of claim 7, wherein the forming of the first line, the spacer, and the first material layer includes:
    forming the first line over the target layer;
    forming the spacer around the first line;
    depositing the first material layer over the target layer; and performing an etch-back process on the first material layer thereby exposing the spacer.

9. The method of claim 7, wherein:
the first line includes a patterning layer portion over a hard mask layer portion; and
the patterning layer portion and the first material layer are formed from the same material.

10. The method of claim 9, wherein the transferring of the fosse pattern trench into the target layer includes:
removing the first material layer and the patterning layer portion thereby leaving the hard mask layer portion as the protection layer over the first portion of the target layer.

11. The method of claim 7, further comprising:
removing the patterned patterning layer.

12. The method of claim 11, further comprising:
removing the protection layer.

13. A method for patterning a target layer on a semiconductor substrate, the method comprising:
forming a first line over the target layer, wherein the first line includes a patterning layer portion over a hard mask layer portion;
forming a spacer around the first line;
depositing a spacer-surrounding material layer, the spacer-surrounding material layer surrounding the spacer;
removing the spacer to form a fosse pattern trench surrounding the first line;
etching the target layer through the fosse pattern trench thereby forming a first trench in the target layer; and
after the etching of the target layer, removing the patterning layer portion and the spacer-surrounding material layer while keeping the hard mask layer portion over a first portion of the target layer, the first portion of the target layer being surrounded by the first trench.

14. The method of claim 13, wherein the patterning layer portion and the spacer-surrounding material layer are formed from the same material.

15. The method of claim 13, before removing the spacer, performing an etch-back process on the spacer-surrounding material layer and the patterning layer portion thereby exposing the spacer.

16. The method of claim 13, further comprising:
depositing a second patterning layer over the semiconductor substrate, the target layer, and the hard mask layer portion, and filling in the first trench;
patterning the second patterning layer to form a second pattern; and
etching the target layer with the second pattern and the hard mask layer portion as an etch mask.

17. The method of claim 16, wherein the etching of the target layer enlarges at least a portion of the first trench.

18. The method of claim 17, further comprising:
removing the second pattern while keeping the hard mask layer portion over the first portion of the target layer.

19. The method of claim 18, further comprising:
removing the hard mask layer portion thereby forming a patterned target layer over the semiconductor substrate.

* * * * *